(12) United States Patent
Inoue et al.

(10) Patent No.: US 8,674,409 B2
(45) Date of Patent: Mar. 18, 2014

(54) HETEROJUNCTION FIELD EFFECT TRANSISTOR, METHOD FOR PRODUCING HETEROJUNCTION FIELD EFFECT TRANSISTOR, AND ELECTRONIC DEVICE

(75) Inventors: Takashi Inoue, Tokyo (JP); Hironobu Miyamoto, Tokyo (JP); Kazuki Ota, Tokyo (JP); Tatsuo Nakayama, Tokyo (JP); Yasuhiro Okamoto, Tokyo (JP); Yuji Ando, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 8 days.

(21) Appl. No.: 13/141,449

(22) PCT Filed: Dec. 25, 2009

(86) PCT No.: PCT/JP2009/071699
§ 371 (c)(1),
(2), (4) Date: Aug. 10, 2011

(87) PCT Pub. No.: WO2010/074275
PCT Pub. Date: Jul. 1, 2010

(65) Prior Publication Data
US 2011/0284865 A1 Nov. 24, 2011

(30) Foreign Application Priority Data

Dec. 26, 2008 (JP) ................................. 2008-335211

(51) Int. Cl.
*H01L 29/66* (2006.01)
(52) U.S. Cl.
USPC .................................. 257/194; 257/E29.253
(58) Field of Classification Search
USPC ............ 257/76, 192–195, E29.247, E29.241, 257/E29.246, E29.251, E29.252, E29.253, 257/94–97, 183, 189
See application file for complete search history.

(56) References Cited

U.S. PATENT DOCUMENTS

| | | | | |
|---|---|---|---|---|
| 5,488,237 A | * | 1/1996 | Kuwata | ......................... 257/194 |
| 2006/0231861 A1 | * | 10/2006 | Akamatsu et al. | ............ 257/192 |

(Continued)

FOREIGN PATENT DOCUMENTS

| | | |
|---|---|---|
| JP | 2006222160 A | 8/2006 |
| JP | 2007173453 A | 7/2007 |

(Continued)

OTHER PUBLICATIONS

International Search Report for PCT/JP2009/071699 mailed Mar. 23, 2010.

*Primary Examiner* — Brook Kebede
(74) *Attorney, Agent, or Firm* — McGinn Intellectual Property Law Group, PLLC

(57) ABSTRACT

A heterojunction filed effect transistor with a low access resistance, a low on resistance, and the like, a method for producing a heterojunction filed effect transistor and an electron device are provided. In the heterojunction field effect transistor, an electron transit layer 11 formed of a III-nitride semiconductor is formed on a substrate 10, an electron supply layer 12 formed of a III-nitride semiconductor forms a heterojunction with an upper surface of the electron transit layer 11, a gate electrode 14, a source electrode 15A, and a drain electrode 15B are arranged on the electron supply layer 12, n-type conductive layer regions 13A and 13B each extended from an upper part of the electron transit layer 11 to an upper surface of the electron supply layer 12 are provided in at least a part below the source electrode 15A and a part below the drain electrode 15B, and an n-type impurity concentration at a heterojunction interface of an electron transit layer 11 part of each of the n-type conductive layer regions 13A and 13B with the electron supply layer 12 is $1 \times 10^{20}$ cm$^{-3}$ or more.

13 Claims, 19 Drawing Sheets

(56) References Cited

U.S. PATENT DOCUMENTS

2006/0244010 A1* 11/2006 Saxler ............................ 257/194
2008/0303064 A1* 12/2008 Sato .............................. 257/194

FOREIGN PATENT DOCUMENTS

| | | |
|---|---|---|
| JP | 2007335768 A | 12/2007 |
| JP | 2007538402 A | 12/2007 |

* cited by examiner ently forming an $n^+$-type layer by ion-

HETEROJUNCTION FIELD EFFECT TRANSISTOR, METHOD FOR PRODUCING HETEROJUNCTION FIELD EFFECT TRANSISTOR, AND ELECTRONIC DEVICE

This application is the National Phase of PCT/JP2009/071699, filed Dec. 25, 2009, which claims priority from Japanese Patent Application No. 2008-335211 filed on Dec. 26, 2008. The entire subject matter of the Japanese Patent Applications is incorporated herein by reference.

TECHNICAL FIELD

The present invention relates to a heterojunction field effect transistor, a method for producing a heterojunction field effect transistor, and an electronic device.

BACKGROUND ART

In these days, selectively forming an $n^+$-type layer by ion-implanting a dopant such as Si into a semiconductor structure (for example, a AlGaN/GaN structure) that is below an ohmic electrode is proposed in order to reduce an access resistance, on resistance, and the like of a GaN heterojunction field effect transistor.

An example of a structure of this type of the GaN heterojunction field effect transistor (common name of HEMT: High Electron Mobility Transistor) is schematically shown in a cross-sectional view of FIG. 19. As shown in FIG. 19, this HEMT 100 is configured so that an electron transit layer 102 of GaN is formed on a substrate 101 via a buffer layer (not shown), and an electron supply layer 103 of AlGaN forms a heterojunction with an upper surface of the electron transit layer 102. A band gap of the electron transit layer 102 is smaller than that of the electron supply layer 103. A gate electrode 106, a source electrode 107A, and a drain electrode 107B are formed on the electron supply layer 103, and the source electrode 107A and the drain electrode 107B are arranged so that the gate electrode 106 is sandwiched between them. An n-type impurity implantation region 105A is formed in a part of a region including an upper part of the electron transit layer 102 and the electron supply layer, being below the source electrode 107A. Similarity, an n-type impurity implantation region 105B is formed in a part of the region including the upper part of the electron transit layer 102 and the electron supply layer, being below the source electrode 107B. When this HEMT 100 is in on state, a channel of a two-dimensional electron gas layer 110 is formed at a heterojunction interface between the electron supply layer 103 and the electron transit layer 102 and in the neighborhood thereof, whereby a current is passed through this two-dimensional electron gas layer 110. A prior art document on such a GaN HEMT can be, for example, Patent Document 1 (JP 2007-335768 A).

PRIOR ART DOCUMENT

Patent Document

Patent Document 1: JP 2007-335768 A

SUMMARY OF INVENTION

Problem to be Solved by the Invention

It is proved in the Patent Document 1 by a theoretical formula and the like that a resistance of HEMT having a structure shown in FIG. 19 is reduced. However, in order to obtain a higher-performance HEMT, further reducing the access resistance, the on resistance, and the like is required.

Hence, the present invention is intended to provide a heterojunction field effect transistor with a low access resistance, a low on resistance, and the like, a method for producing a heterojunction filed effect transistor (hereinafter also referred to as a heterojunction field effect transistor production method), and an electronic device.

Means for Solving Problem

In order to achieve the aforementioned object, the heterojunction field effect transistor includes: a substrate; an electron transit layer formed of a III-nitride semiconductor, the electron transit layer being formed on the substrate; an electron supply layer formed of a III-nitride semiconductor, the electron supply layer forming a heterojunction with an upper surface of the electron transit layer; a gate electrode; a source electrode; and a drain electrode, the gate electrode, the source electrode, and the drain electrode being arranged on the electron supply layer; wherein n-type conductive layer regions each extended from an upper part of the electron transit layer to an upper surface of the electron supply layer are provided in at least a part below the source electrode and a part below the drain electrode, and a concentration of an n-type impurity at a heterojunction interface of an electron transit layer part in each of the n-type conductive layer regions with the electron supply layer is $1 \times 10^{20}$ cm$^{-3}$ or more.

The heterojunction field effect transistor production method of the present invention includes: an electron transit layer forming step of forming, on a substrate, an electron transit layer formed of a III-nitride semiconductor; an electron supply layer forming step of forming an electron supply layer through formation of a heterojunction between an upper surface of the electron transit layer and a III-nitride semiconductor; an n-type conductive layer region forming step of forming n-type conductive layer regions by doping at least a part of a source electrode formation planned region and a part of a drain electrode formation planned region in a region including an upper part of the electron transit layer and the electron supply layer with an n-type impurity ion so that a concentration of the n-type impurity ion at a heterojunction interface of an upper part of the electron transit layer with the electron supply layer becomes $1 \times 10^{20}$ cm$^{-3}$ or more and activating the n-type impurity ion by an annealing treatment; a source electrode forming step of forming an source electrode on the source electrode formation planned region; a drain electrode forming step of forming a drain electrode on the drain electrode formation planned region; and a gate electrode forming step of forming a gate electrode on a region between the source electrode formation planned region and the drain electrode formation planned region.

The electronic device of the present invention includes the heterojunction field effect transistor of the present invention or a heterojunction field effect transistor produced by the heterojunction field effect transistor production method of the present invention.

Effects of the Invention

According to the present invention, it is possible to provide a heterojunction filed effect transistor with a low access resistance, a low on resistance, and the like, a heterojunction field effect transistor production method, and an electronic device.

DESCRIPTION OF EMBODIMENTS

The embodiments of the present invention are described below with reference to the drawings. Note here that the following embodiments are illustrative, and the present invention is not limited thereto. In the cross-sectional views, dimensional rations of components are different from actual sizes for convenience of description.

[First Embodiment]

A first embodiment of the present invention is described. A part of a step of producing a heterojunction field effect transistor (common name of HEMT: High Electron Mobility Transistor) according to the present embodiment is shown in a cross-sectional view of FIG. 1. A cross-sectional structure of HEMT 1 of the present embodiment is schematically shown in a cross-sectional view of FIG. 2.

Figure 2:
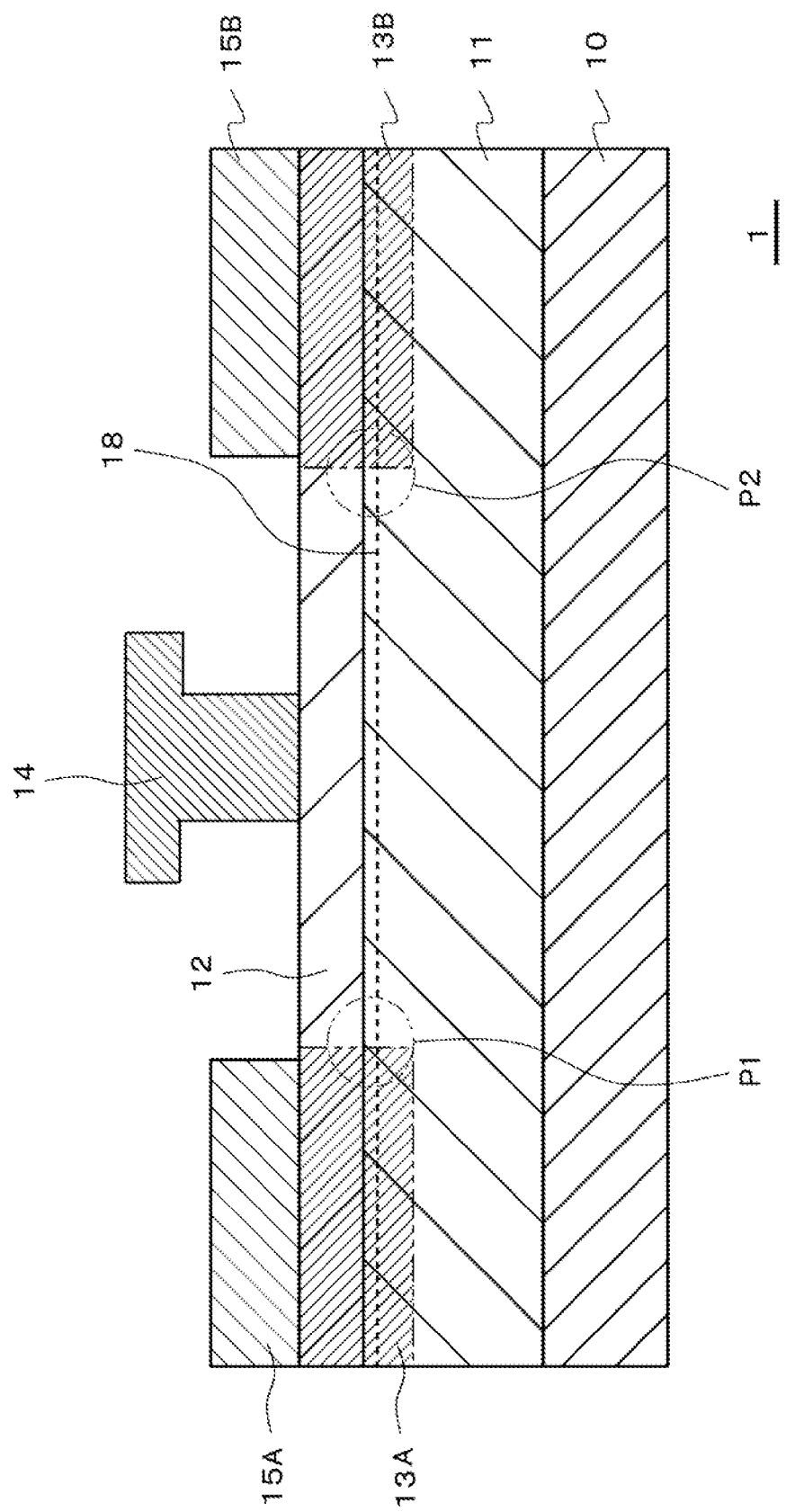
FIG. 2 is a diagram schematically illustrating a cross-sectional structure of GaN HEMT of the first embodiment.

As shown in FIG. 2, this HEMT 1 is configured so that an electron transit layer II formed of a III-nitride semiconductor is formed on a substrate 10, and an electron supply layer 12 formed of a III-nitride semiconductor forms a heterojunction with an upper surface of this electron transit layer 11. The electron transit layer 11 may be formed on the substrate 10 via a buffer layer (not shown). Note here that in the present invention, a state where a component is "on" a thing may indicate a state where the component is directly in contact with an upper surface of the thing via no other component or a state where the component is on an upper surface of a thing via other component, unless otherwise mentioned. The same applies to a state where a component is "below" a thing. Note here that a state where a component is "on an upper surface" of a thing indicates a state where the component is directly in contact with an upper surface of the thing via no other component. The same applies to a state where a component is "on a lower surface" of a thing. A band gap of the electron supply layer 12 is wider than that of the electron transit layer 11. A gate electrode 14, a source electrode 15A, and a drain electrode 15B are arranged on this electron supply layer 12.

The source electrode 15A and the drain electrode 15B are arranged so that the gate electrode 14 is sandwiched between them. An n-type conductive layer region (n-type impurity implantation region) 13A extended from an upper part of the electron transit layer 11 to an upper surface of the electron supply layer 12 is formed below the source electrode 15A. An n-type conductive layer region (n-type impurity implantation region) 13B extended from the upper part of the electron transit layer 11 to the upper surface of the electron supply layer 12 is formed below the drain electrode 15B. A concentration of an n-type impurity (hereinafter also referred to as an n-type impurity concentration) in each of the n-type conductive layer regions (n-type impurity implantation regions) 13A and 13B is $1 \times 10^{20}$ cm$^{-3}$ or more. As described below, a two-dimensional electron gas layer 18 is formed in the neighborhood of a heterojunction interface of the upper part of the electron transit layer 11 with the electron supply layer 12. The n-type conductive layer regions 13A and 13B with the depth from the upper surface of the electron supply layer 12 toward the two-dimensional electron gas layer 18 are formed. When this HEMT 1 is in on state, a channel region of the two-dimensional electron gas layer 18 is formed at the heterojunction interface of the electron transit layer 11 with the electron supply layer 12 and in the neighborhood thereof. The channel region of the two-dimensional electron gas layer 18 electrically connects between the n-type conductive layer regions 13A and 13B, whereby it becomes possible for a current to pass through the channel region.

In the HEMT 1, a two-dimensional electron gas can be generated at the heterojunction interface between the electron transit layer 11 and the electron supply layer 12 and in the neighborhood thereof from a piezo effect, a spontaneous polarization effect, and the like. When the electron transit layer 11 is formed of GaN (gallium nitride), and the electron supply layer 12 is formed of AlGaN (aluminum gallium nitride), positive fixed space charges are generated at the heterojunction interface from spontaneous polarization and piezo polarization. Then, electrons are attracted to the positive fixed space charges, so that the two-dimensional electron gas layer 18 is formed. In the case where an electron affinity (energy required to excite an electron from the bottom of the conduction band $E_c$ to the vacuum level $E_{vac}$) of the electron transit layer 11 is indicated by and that of the electron supply layer 12 is indicated by $\chi_{12}$, a relationship between the electron affinities satisfies $\chi_{11} > \chi_{12}$ and energy discontinuity at the bottom of the conduction band, represented by $\Delta Ec = |\chi_{11} - \chi_{12}|$, is generated at the heterojunction interface between the electron transit layer 11 and the electron supply layer 12. This energy discontinuity of $\Delta E_c$ results in formation of a two-dimensional electron gas layer 18 of an electron storage layer on the electron transit layer side of this heterojunction interface, and the two-dimensional electron gas layer 18 forms a channel. Such a combination of the electron transit layer 11 and the electron supply layer 12 can be, for example, a combination of GaN epitaxial layers each grown on a Ga face (or an Al face) (specifically, a combination of a GaN layer and a AlGaN layer or a combination of an InGaN layer and an AlGaN layer). It is also possible to form the two-dimensional electron gas layer 18 at the heterojunction interface and in the neighborhood thereof by introducing an n-type impurity into the electron supply layer 12.

In the present embodiment, the n-type conductive layer regions 13A and 13B are $n^+$-type regions each with a high concentration of an n-type impurity. Therefore, a junction resistance at a junction part P1 between a channel region in the electron transit layer 11, being below the gate electrode 14, and the n-type conductive layer region 13A is low, and a junction resistance at a junction part P2 between the channel region and the n-type conductive layer region 13B is also low. In the present embodiment, the junction part P1 is a boundary part between the n-type conductive layer region 13A and the two-dimensional electron gas layer 18, and the junction part P2 is a boundary part between the n-type conductive layer region 13B and the same. The two-dimensional electron gas layer 18 includes, for example, a part of the heterojunction interface between the electron transit layer 11 and the electron supply layer 12, being below the gate electrode 14, into which an n-type impurity is not implanted.

In the HEMT of the present invention, the n-type conductive layer regions are formed in at least a part below the source electrode and a part below the drain electrode of a region including the upper part of the electron transit layer and the electron supply layer. An each upper part of the electron transit layer in each of the n-type conductive layer regions is not particularly limited and preferably has a depth reaching the two-dimensional electron gas layer and more preferably has a depth reaching the lowest part of the two dimensional electron gas layer. The two-dimensional electron gas is concentrated in the neighborhood of the heterojunction interface of the electron transit layer with the electron supply layer. Therefore, for example, it is only necessary that each of the n-type conductive layer regions includes the heterojunction interface. The each upper pan of the electron transit layer in each of the n-type conductive layer regions has a depth from the heterojunction interface of preferably 10 nm or more, more preferably 20 nm or more, and yet more preferably 30 nm or more.

Figure 19:
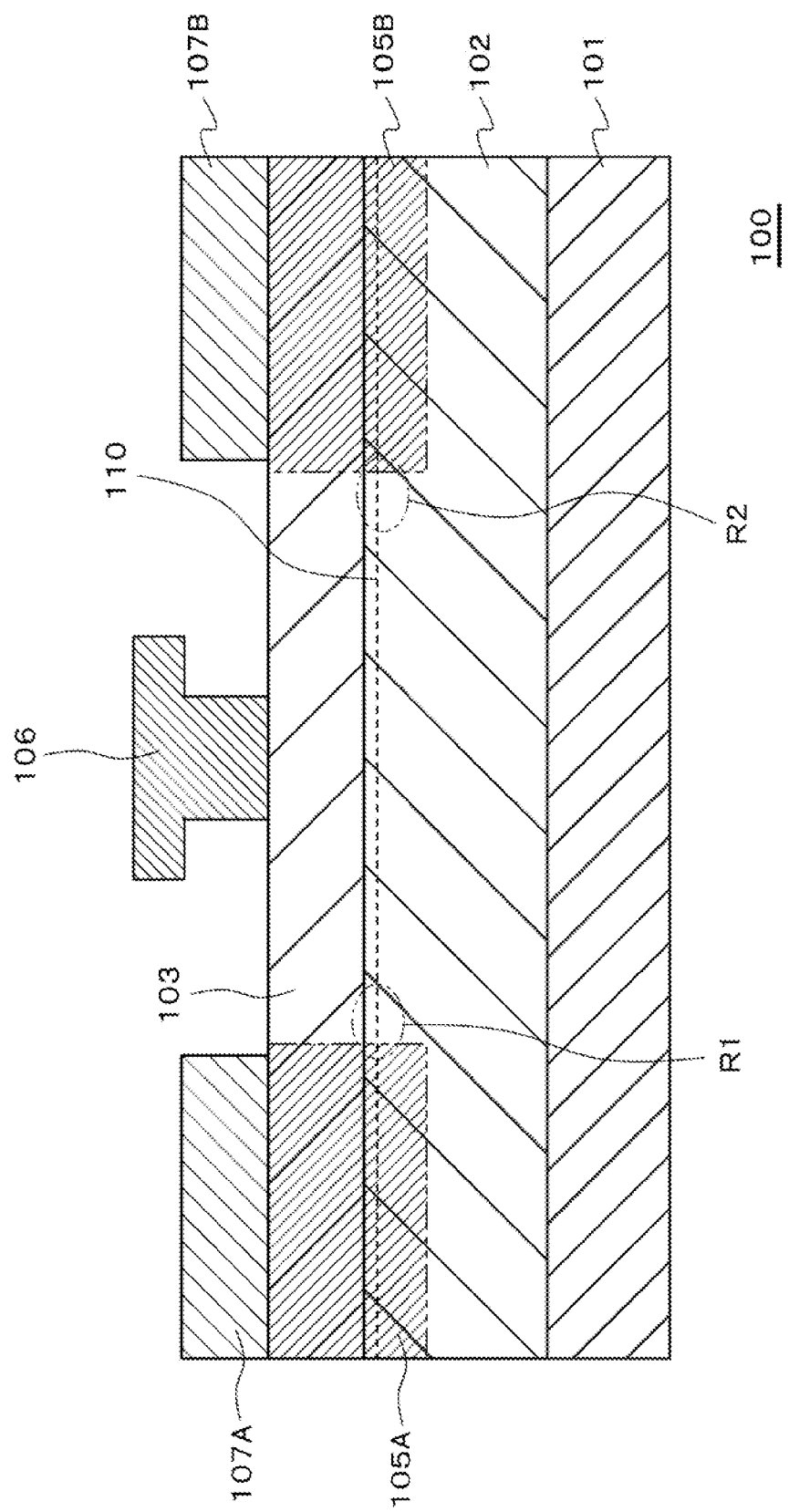
FIG. 19 is a diagram schematically illustrating an example of a cross-sectional structure of a GaN HEMT.

The inventors of the present invention were focused on the problem in that an access resistance, an on resistance, and the like of the GaN HEMT such as shown in FIG. 19 become large to the extent of not being able to disregard in a device operation and conducted examinations through experiments and the like. As a result, they found out a cause of the problem. The cause is that an electric resistance (junction resistance) at each of a junction part R1 between the n-type impurity implantation region 105A and a region (in which a channel should be formed), being below the gate electrode 106 in the two-dimensional electron gas (2DEG) layer 110 and a junction part R2 between the n-type impurity implantation region 105B and the same is high. This junction resistance (contact resistance) causes an access resistance, an on resistance, and the like of the HEMT 100 to increase. The detail is described below.

It is considered that specifically in a heterojunction field effect transistor that operates in an enhancement mode having normally-off characteristics, an access resistance, an on resistance, and the like of an element can be reduced by reducing a junction resistance at each of the junction parts R1 and R2 through a selective formation of n-type layers. Further, for example, it is considered that reducing the junction resistance is effective in order to obtain a GaN HEMT that is superior in property of having a low on resistance as compared with a SiC power device. From this viewpoint, the inventors of the present invention conducted earnest studies and arrived at the present invention.

In the HEMT of the present invention, the "on resistance" refers to an electric resistance between a source electrode and a drain electrode at the time when the HEMT is on (at the time when a voltage is applied between the source electrode and the drain electrode). The "access resistance" refers to an electric resistance between the source electrode or the drain electrode and the two-dimensional electron gas. The "contact resistance" refers to a resistance between two parts directly in contact with each other, and for example, the "ohmic contact resistance" refers to an electric resistance between an ohmic electrode and an electron supply layer when the ohmic electrode (the source electrode or the drain electrode) is directly in contact with the electron supply layer.

As described above, n-type conductive layer regions each extended from the upper part of the electron transit layer to the upper surface of the electron supply layer are provided in at least a part below the source electrode and a part below the drain electrode of the heterojunction field effect transistor (HEMT) of the present invention, and an n-type impurity concentration at a heterojunction interface of the electron transit layer part in each of the n-type conductive layer regions with the electron supply layer is $1\times10^{20}$ cm$^{-3}$ or more. As described above, in the HEMT of the present invention, the n-type impurity concentration at the heterojunction interface is extremely high. Therefore, an n-type impurity concentration at each junction part between each of the n-type conductive layer regions and a part other than the n-type conductive layer regions in the heterojunction interface is also high. Thus, a conduction band potential at the each junction part is reduced, whereby a height of a potential barrier at the each junction part is reduced, and a resistance at the each junction part is reduced. When the resistance at the each junction part is reduced, it becomes possible to reduce the access resistance, the on resistance, and the like.

Figure 12:
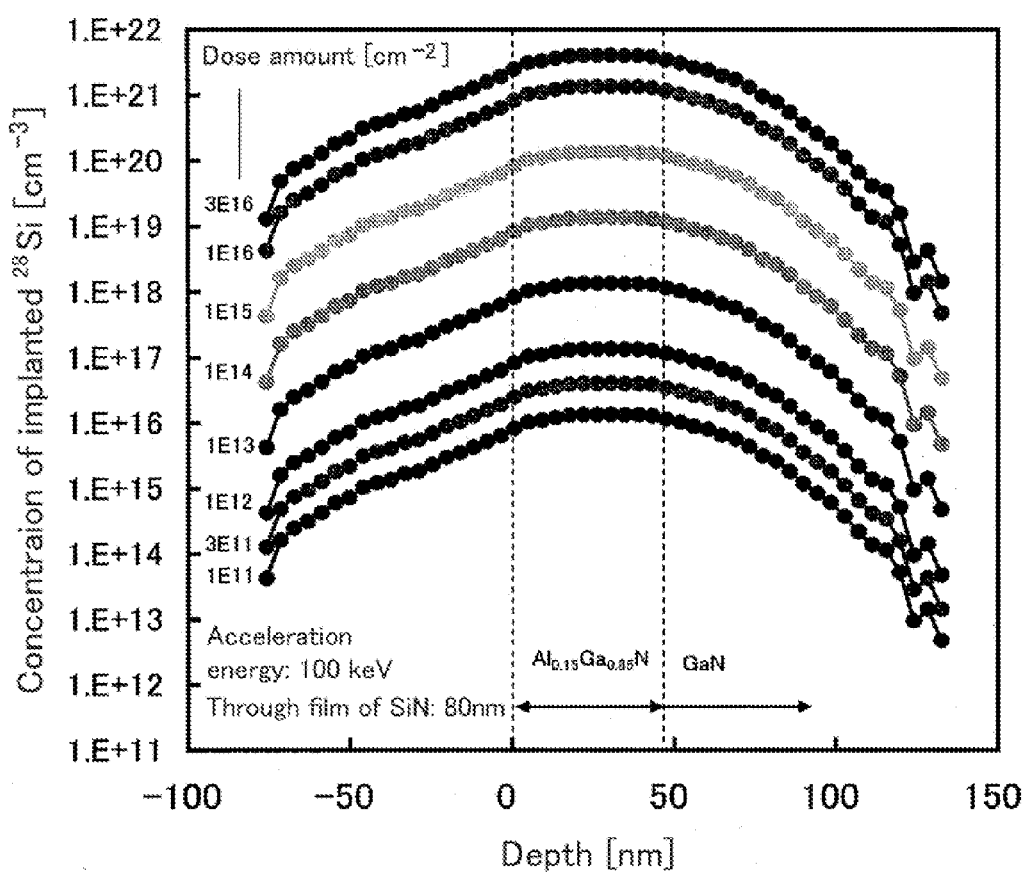
FIG. 12 is a graph illustrating dose amounts and changes in concentration of a donor impurity (n-type impurity).

A distribution of the n-type impurity concentration in each of the n-type conductive layer regions is not particularly limited and is represented by a function of a depth as shown in FIG. 12 described below. The standard of the depth is not particularly limited and can be, for example, indicated by the depth from the surface of the electron supply layer as shown in FIG. 12. An n-type impurity concentration, i.e., an n-type impurity volume density in the neighborhood of the heterojunction interface of the electron transit layer part in each of the n-type conductive layer regions with the electron supply layer can be, for example, represented by a function of z when the depth z from the heterojunction interface is set to be a variable. In this case, the "n-type impurity concentration at the heterojunction interface with the electron supply layer" is an n-type impurity concentration when z=0. This value can be measured by a general measurement device, for example. The same applies to a concentration of an ionized n-type impurity (hereinafter also referred to as an "ionized n-type impurity concentration". An n-type impurity concentration is $1\times10^{20}$ cm$^{-3}$ or more in the electron transit layer part of each of the n-type conductive layer regions, with a depth from the heterojunction interface of preferably 10 nm or more, more preferably 20 nm or more, and yet more preferably 30 nm or more. When the n-type impurity concentration is $1\times10^{20}$ cm$^{-3}$ or more in a region including these depths, the junction resistance and the like at the each junction part can be reduced further effectively. When the n-type impurity concentration is $1 \times 10^{20}$ cm$^{-3}$ or more in the region including these depths, the n-type impurity concentration (volume density) at the heterojunction interface becomes $1 \times 10^{20}$ cm$^{-3}$ or more.

From the viewpoint of further reducing the access resistance and the like of the HEMT of the present invention, it is preferred that the n-type impurity concentration is $1 \times 10^{20}$ cm$^{-3}$ or more in each of the entire n-type conductive layer regions (each extended from the upper part of the electron transit layer to the upper surface of the electron supply layer). The upper limit of the n-type impurity (donor impurity) concentration in each of the n-type conductive layer regions is preferably $10^{22}$ cm$^{-3}$ or less from the viewpoint of favorability of a crystal quality.

A part other than the n-type conductive layer regions in a region including the upper part of the electron transit layer and the electron supply layer of the HEMT of the present invention is, for example, undoped. It is, however, not limited thereto. The part other than the n-type conductive layer regions may not at all contain an n-type impurity or may contain a small amount of the n-type impurity, for example. For example, as described above, it may be possible that an n-type impurity is introduced into the electron supply layer (the electron supply layer is doped with an n-type impurity), so that a two-dimensional electron gas layer is formed at the heterojunction interface between the electron supply layer and the electron transit layer and in the neighborhood thereof. An n-type impurity concentration in an electron supply layer part of the part other than the n-type conductive layer regions is not particularly limited. An n-type impurity concentration in an electron transit layer part of the part also is not particularly limited and is, for example, $1 \times 10^{17}$ cm$^{-3}$ or less, preferably $1 \times 10^{16}$ cm$^{-3}$ or less, and more preferably $1 \times 10^{15}$ cm$^{-3}$ or less. An n-type impurity concentration at a border of the part other than the n-type conductive layer regions in the region including the upper part of the electron transit layer and the electron supply layer with each of the n-type conductive layer regions generally is not reduced step by step but reduced gradually. More specifically, for example, there is a transition region at the border of the part other than the n-type conductive layer regions with each of the n-type conductive layer regions, and the n-type impurity concentration is gradually reduced in the transition region. The width of the transition region in the direction of the plane of the electron transit layer is generally changed in approximate proportion to a range distance of implanted ions in ion implantation and is, for example, a half of the range distance.

In the HEMT of the present invention, it is preferred that an ionized n-type impurity concentration at a heterojunction interface of the electron transit layer part in each of the n-type conductive layer regions with the electron supply layer is $1 \times 10^{19}$ cm$^{-3}$ or more under the temperature condition from 5° C. to 35° C. It is because that in the case where a temperature at which the HEMT of the present invention is operated is room temperature, i.e., from 5° C. to 35° C., when the ionized n-type impurity concentration satisfies the above-described condition, the junction resistance and the like can be easily reduced. However, there is a case that the temperature at which the HEMT of the present invention is operated widely differs from room temperature according to the use of the HEMT of the present invention. The case can be a case that the HEMT of the present invention is operated in an engine room of vehicle, for example. In such a case, it is preferred that the ionized n-type impurity concentration at the heterojunction interface of the electron transit layer part in each of the n-type conductive layer regions with the electron supply layer is $1 \times 10^{19}$ cm$^{-3}$ or more under the temperature condition from 5° C. to 35° C. The temperature at which the HEMT of the present invention is operated is not particularly limited and is, for example, room temperature. When the HEMT of the present invention is operated in an engine room of vehicle, the temperature is, for example, from 5° C. to 250° C. The ionized n-type impurity concentration is $1 \times 10^{19}$ cm$^{-3}$ or more in the electron transit layer part of each of the n-type conductive layer regions, with the depth from the heterojunction interface of preferably 10 nm or more, more preferably 20 nm or more, and yet more preferably 30 nm or more. In this case, a temperature condition under which the ionized n-type impurity concentration is measured is, as described above, from 5° C. to 35° C. or the temperature at which the HEMT of the present invention is operated. When the ionized n-type impurity concentration is $1 \times 10^{19}$ cm$^{-3}$ or more in a range including these depths, a junction resistance at the each junction part can be reduced further effectively. When the ionized n-type impurity concentration is $1 \times 10^{19}$ cm$^{-3}$ or more in the range including these depths, an ionized n-type impurity concentration (volume density) at the heterojunction interface becomes $1 \times 10^{19}$ cm$^{-3}$ or more. From the viewpoint of further reducing the access resistance and the like, it is particularly preferred that the ionized donor impurity concentration (ionized n-type impurity concentration) under the temperature condition from 5° C. to 35° C. or the temperature condition under which the HEMT of the present invention is operated is $1 \times 10^{19}$ cm$^{-3}$ or more in each of entire n-type conductive layer regions (each extended from the upper part of the electron transit layer to the upper surface of the electron supply layer). In the present invention, the ionized donor impurity concentration (ionized n-type impurity concentration) refers to a concentration in the state where a voltage is applied to none of the source electrode, the gate electrode, and the drain electrode in the HEMT.

The reason why the junction resistance tends to reduce when the ionized donor impurity concentration (ionized n-type impurity concentration) is $1 \times 10^{19}$ cm$^{-3}$ or more is not always clear.

The reason is considered that an electron distribution is degenerated because a distance between atoms of the donor (n-type impurity) becomes short, and conduction in field emission tunneling mechanism becomes dominant. Note here that this is an example of assumable mechanism and do not limit the present invention.

In the HEMT of the present invention, it is preferred that the electron transit layer is formed of gallium nitride (GaN) or gallium indium nitride (InGaN). It is preferred that the electron supply layer is formed of aluminum gallium nitride (AlGaN), gallium indium nitride (InGaN), or aluminum indium nitride (InAlN). The combination of the electron transit layer and the electron supply layer is not particularly limited, and a combination in which a band gap of the electron supply layer is larger than that of the electron transit layer can be selected as appropriate with reference to a general HEMT and the like. As mentioned above, the electron supply layer may be doped with an n-type impurity.

The HEMT production method of the present invention is not particularly limited, and the HEMT is produced preferably by the heterojunction field effect transistor production method of the present invention. HEMT produced by the heterojunction field effect transistor production method of the present invention is not particularly limited, and is preferably the HEMT of the present invention.

The HEMT production method of the present embodiment shown in FIG. 2 is not particularly limited, and the HEMT can be produced by the following production method. That is, first, an electron transit layer 11 formed of a III-nitride semiconductor is formed on a substrate 10 (electron transit layer forming step). Then, an electron supply layer 12 is formed thorough formation of a heterojunction between an upper surface of the electron transit layer 11 and an III-nitride semiconductor (electron supply layer forming step). As the substrate 10, a silicon substrate, a sapphire substrate, or a silicon carbide substrate can be used, for example. The electron transit layer 11 and the electron supply layer 12 can be formed by epitaxial growth. Examples of an epitaxial growth method include a Metal-Organic Vapor Phase Epitaxy (MOVPE) method and a Molecular Beam Epitaxy (MBE) method. The Metal-Organic Vapor Phase Epitaxy method is also referred to as an MOCVD (Metal Organic Chemical Vapor Deposition) method. For example, it is possible to epitaxially growing a buffer layer (not shown) on the substrate 10 and thereafter continuously and epitaxially growing the electron transit layer 11 of GaN and the electron supply layer 12 of AlGaN. Examples of the buffer layer between the substrate 10 and the electron transit layer 11 include III-nitride compound semiconductors of AlN, GaN, and AlGaN. For example, it is also possible to abbreviate the buffer layer by the use of a III-nitride semiconductor substrate of GaN, AlN, or the like as substitute for a silicon substrate, a sapphire substrate, a silicon carbide substrate, or the like.

Figure 1:
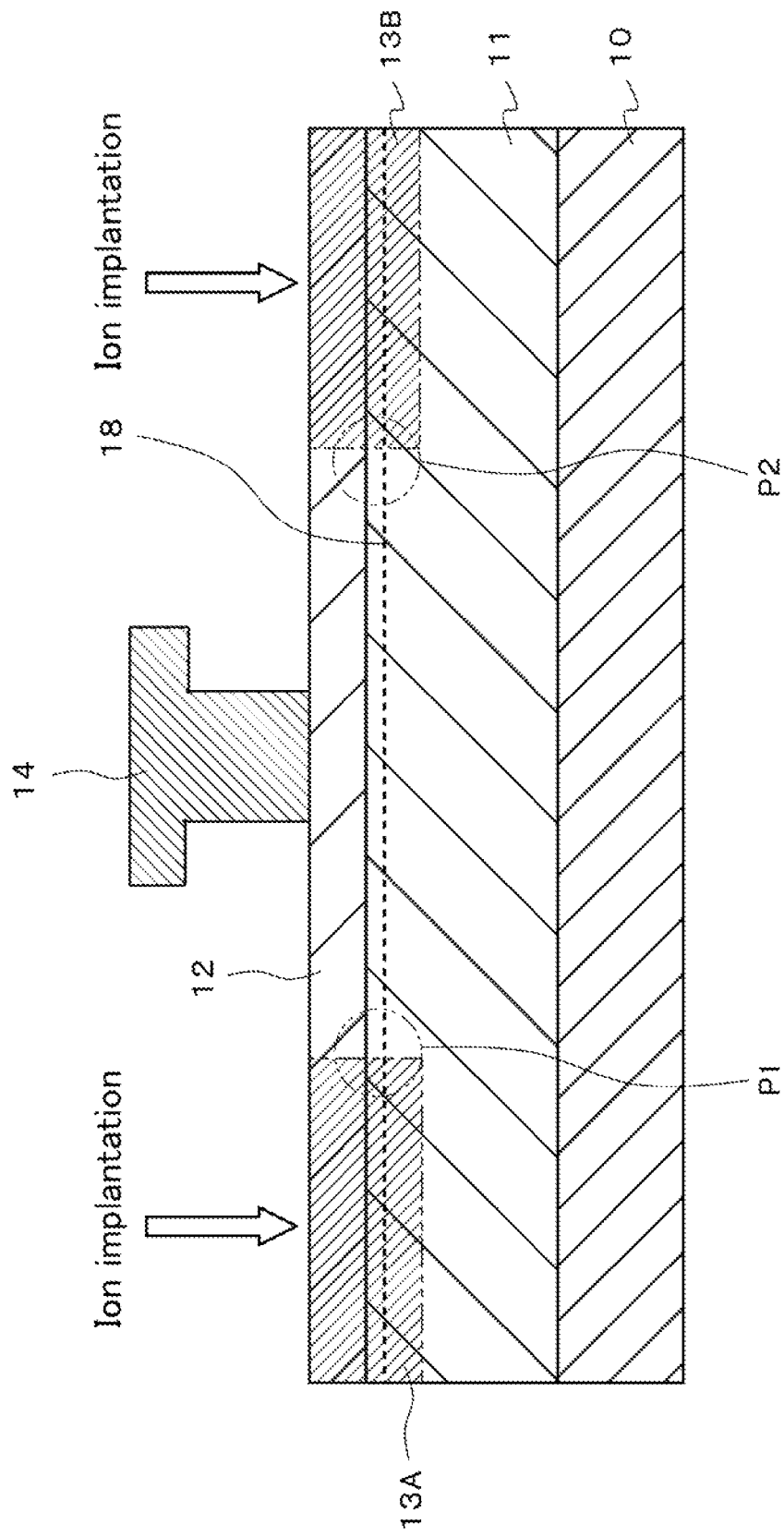
FIG. 1 is a cross-sectional view illustrating a production step in a first embodiment according to the present invention.

After the formation of the electron supply layer 12 on the electron transit layer 11, a nitride film such as SiN is deposited as a through film (not shown) on the electron supply layer 12. Then, a resist film (not shown) that has been patterned using a photolithography technology is formed on this through film. Thereafter, as shown in FIG. 1, silicon (atomic weight: 28) is selectively ion-implanted from the upper surface of the electron supply layer 12 to a depth beyond the heterojunction interface using this resist film as a mask. Then, the through film is removed.

In order to prevent a surface of a semiconductor layer from degenerating due to an annealing treatment, the surface of the semiconductor layer is coated with an annealing protective film prior to the annealing treatment. It is only necessary that a region in which the annealing treatment is conducted is subjected to the coating with the annealing protective film. However, for example, the annealing protective film is formed on each of the entire substrate 10, electron transit layer 11, and electron supply layer 12 (upper surfaces, back surfaces, and side walls). Thereafter, the electron transit layer 11 and the electron supply layer 12 are subjected to the annealing treatment, so that the n-type impurity that has been ion-implanted is activated. Then, the annealing protective film is removed. As a result, as shown in FIG. 1, the n-type conductive layer regions 13A and 13B each having a high concentration (ionized donor impurity concentration of $10^{19}$ cm$^{-3}$ or more) can be formed (n-type conductive layer region forming step).

In the n-type conductive layer region forming step, for example, at least a part of a source electrode formation planned region and a part of a drain electrode formation planned region in a region including the upper part of the electron transit layer and the electron supply layer are doped with n-type impurity ions so that an n-type impurity ion concentration at the heterojunction interface of the electron transit layer part with the electron supply layer becomes $1\times10^{20}$ cm$^{-3}$ or more. The doping is conducted so that a n-type impurity concentration becomes $1\times10^{20}$ cm$^{-3}$ or more in the upper part of the electron transit layer with the depth from the heterojunction interface of preferably 10 nm or more, more preferably 20 nm or more, and yet more preferably 30 nm or more. Particularly preferably, at least a part of a source electrode formation planned region and a part of a drain electrode formation planned region are doped with n-type impurity ions so that an n-type impurity ion concentration becomes $1\times10^{20}$ cm$^{-3}$ or more from the upper part of the electron transit layer to the upper surface of the electron supply layer. In this case, it is preferred that at least a part of a source electrode formation planned region and a part of a drain electrode formation planned region in a region including the upper part of the electron transit layer and the electron supply layer are doped with n-type impurity ions with an effective dose amount of the n-type impurity ions of $5\times10^{15}$ cm$^{-2}$ or more. When the effective dose amount is $5\times10^{15}$ cm$^{-2}$ or more, an n-type impurity ion concentration in the region including the upper part of the electron transit layer and the electron supply layer easily becomes $1\times10^{20}$ cm$^{-3}$ or more. From the viewpoint of favorability of a crystal quality, the upper limit of the implanted donor impurity concentration is $10^{22}$ cm$^{-3}$.

In the present invention, in the case where the n-type impurity (donor impurity) concentration or the like is represented by a volume density (cm$^{-3}$ or the like), the volume density represents a volume density with respect to the number of atoms unless otherwise indicated. Similarly, in the case where the effective dose amount or the like of the n-type impurity ions is represented by an area density (cm$^{-2}$ or the like), the area density represents an area density with respect to the number of atoms unless otherwise indicated. The "effective dose amount" refers to an actual dose amount of the n-type impurity ions that has been reached to the upper surface of an electron absorption layer after subtracting an amount of loss such as an amount absorbed into the through film and the like.

The n-type impurity concentration generally is not reduced step by step but reduced gradually at a border of a part (the part other than the n-type conductive layer regions) that has been masked with a mask for ion implantation (resist film) in a region including the upper part of the electron transit layer and the electron supply layer with a part (each of the n-type conductive layer regions) that has not been masked with the mask for ion implantation. More specifically, for example, there is a transition region at the border of the part other than the n-type conductive layer regions with each of the n-type conductive layer regions, and the n-type impurity concentration is gradually reduced in the transition region. The width of the transition region in the direction of the plane of the electron transit layer is generally changed in approximate proportion to a range distance of implanted ions in an ion implantation and is, for example, a half of the range distance.

The annealing treatment can be conducted by RTA (Rapid Thermal Annealing) under an atmosphere of nitrogen. In order to obtain a high ionized donor impurity concentration (high ionized n-type impurity concentration), the annealing treatment is conducted preferably at a temperature from 1,100° C. to 1,300° C. The temperature in the annealing treatment is preferably from 1,100° C. to 1,300° C., more preferably from 1,125° C. to 1,225° C., and particularly preferably from 1,150° C. to 1,300° C. More specifically in order to obtain a high activation yield of an n-type impurity that has been ion-implanted, the lower limit of the temperature in the annealing treatment is preferably 1,100° C. or more, more preferably 1,125° C. or more, and yet more preferably 1,150° C. or more. From the viewpoint of suppressing degeneration of a surface of a III-nitride semiconductor layer through suppression of desorption of nitrogen from the III-nitride semiconductor layer, the upper limit of the temperature in the annealing treatment is preferably 1,300° C. or less, more preferably less than 1,300° C., and yet more preferably 1,225° C. or less. A time of the annealing treatment is not particularly limited and is set from 30 seconds to 5 minutes according to a performance of a heat treatment device used for heating, for example.

In the case of using a substrate such as a silicon (Si) substrate, tending to be plastically deformed at high temperature, an activation annealing of the n-type impurity may be conducted at a temperature that is lower that the above-described temperature in activation annealing such as 1,000° C. By conducting the annealing treatment at relatively low temperature, it becomes possible to reduce bowing of wafer and a defect in an epitaxial film, and, in addition, it becomes possible to reduce a leakage current (maintain a pressure at which a device can be operated). When the annealing treatment is conducted at relatively low temperature, it is necessary to conduct it for relatively long time. For example, when the annealing treatment is conducted at 1,000° C., the time of the annealing treatment is preferably 20 minutes or more.

It is preferred that in the n-type conductive layer region forming step, the annealing treatment is conducted so that the ionized n-type impurity concentration at the heterojunction interface of the electron transit layer part in each of the n-type conductive layer regions with the electron supply layer becomes $1 \times 10^{19}$ $cm^{-3}$ or more under a temperature condition from 5° C. to 35° C. It is preferred that in the n-type conductive layer region forming step, the annealing treatment is conducted so that the ionized n-type impurity concentration at the heterojunction interface of the electron transit layer part in each of the n-type conductive layer regions with the electron supply layer becomes $1 \times 10^{19}$ $cm^{-3}$ or more under a temperature condition under which a heterojunction field effect transistor is operated. By conducting the annealing treatment as described above, a low junction resistance can be obtained at each of a junction part P1 between the n-type conductive layer region 13A and a channel region that is below the gate electrode 14 and a junction part P2 between the n-type conductive layer region 13B and the channel region. The annealing treatment is conducted so that the ionized n-type impurity concentration at the heterojunction interface of the electron transit layer part in each of the n-type conductive layer regions with the electron supply layer becomes $1 \times 10^{19}$ $cm^{-3}$ or more under a temperature condition from 5° C. to 35° C. in the electron transit layer part of each of the n-type conductive layer regions with the depth from the heterojunction interface of more preferably 10 nm or more, yet more preferably 20 nm or more, and even more preferably 30 nm or more. In this case, the temperature condition under which the ionized n-type impurity concentration is measured is, as described above, from 5° C. to 35° C. or a temperature condition under which the HEMT of the present invention is operated. When the ionized n-type impurity concentration is $1 \times 10^{19}$ $cm^{-3}$ or more in a range including these depths, the junction resistance and the like at the each junction part can be reduced further effectively. When the ionized n-type impurity concentration is $1 \times 10^{19}$ $cm^{-3}$ or more in the range including these depths, the ionized n-type impurity concentration (volume density) at the heterojunction interface becomes $1 \times 10^{19}$ $cm^{-3}$ or more. From the viewpoint of further reducing the access resistance and the like, it is particularly preferred that the annealing treatment is conducted so that the ionized donor impurity concentration (ionized n-type impurity concentration) becomes $1 \times 10^{19}$ $cm^{-3}$ or more in each of entire n-type conductive layer regions (each extended from the upper part of the electron transit layer to the upper surface of the electron supply layer) under the temperature condition from 5° C. to 35° C. or the temperature condition under which the HEMT is operated.

Further, an insulation film (not shown) provided with an aperture is formed on the electron supply layer 12, and a metal material is buried in this aperture, which is then subjected to an alloy treatment. Thus, a gate electrode 14 having a T-shaped cross-sectional shape is formed (gate electrode forming step). The gate electrode 14 is not particularly limited and can be formed of, for example, a metal material such as W, Mo, Si, Ti, Pt, Nb, Al, or Au or a laminate of layers of two or more types of the metal materials among them. The cross sectional shape of the gate electrode 14 is not limited to the T-shaped cross-sectional shape and may be any shape. The gate electrode forming step may be conducted before or after the n-type conductive layer region forming step or may be conducted between the doping with the n-type impurity and the annealing treatment, for example.

Thereafter, for example, by a lift-off treatment, an source electrode 15A is formed on the source electrode formation planned region, and the drain electrode 15B is formed on the drain electrode formation planned region (source electrode forming step and drain electrode forming step). More specifically, for example, a resist pattern is formed on the electron supply layer 12 using a photolithography, and thereafter, a metal film is formed on the resist pattern and the electron supply layer 12 by a sputtering method. Then, the resist pattern and a metal material thereon are removed simultaneously, whereby the respective electrode patterns of a source electrode 15A and a drain electrode 15B, each being in ohmic contact with the electron supply layer 12 can be formed. The source electrodes 15A and the drain electrode 15B are not particularly limited and each can be formed of, for example, a metal material such as tungsten (W), molybdenum (Mo), silicon (Si), titanium (Ti), platinum (Pt), niobium (Nb), aluminum (Al), or gold (Au) or a laminate (for example, a Ti/Al/Nb/Au structure) of layers of two or more types of metal materials among them.

An $n^+$-type region having a high concentration (ionized donor impurity concentration of $10^{19}$ $cm^{-3}$ or more) is formed in each of the n-type conductive layer regions 13A and 13B of the HEMT 1 of the present embodiment (first embodiment). By this formation, a conduction band potential at each of the junction parts P1 and P2 in each $n^+$-type region is significantly reduced. As a result, an electric resistance (junction resistance) at each of the junction parts P1 and P2 is reduced to the extent of being able to disregard in a device operation. Thus, reducing an access resistance, an on resistance, and the like can be achieved. Note here that this description is illustrative and does not limit the HEMT 1 of the present embodiment and the HEMT of the present invention.

[Second Embodiment]

A second embodiment of the present invention is described. A part of the step of producing a HEMT according to the present embodiment is shown in a cross-sectional view of FIG. 3. A cross-sectional structure of HEMT 2 of the present embodiment is schematically shown in a cross-sectional view of FIG. 4.

Figure 4:
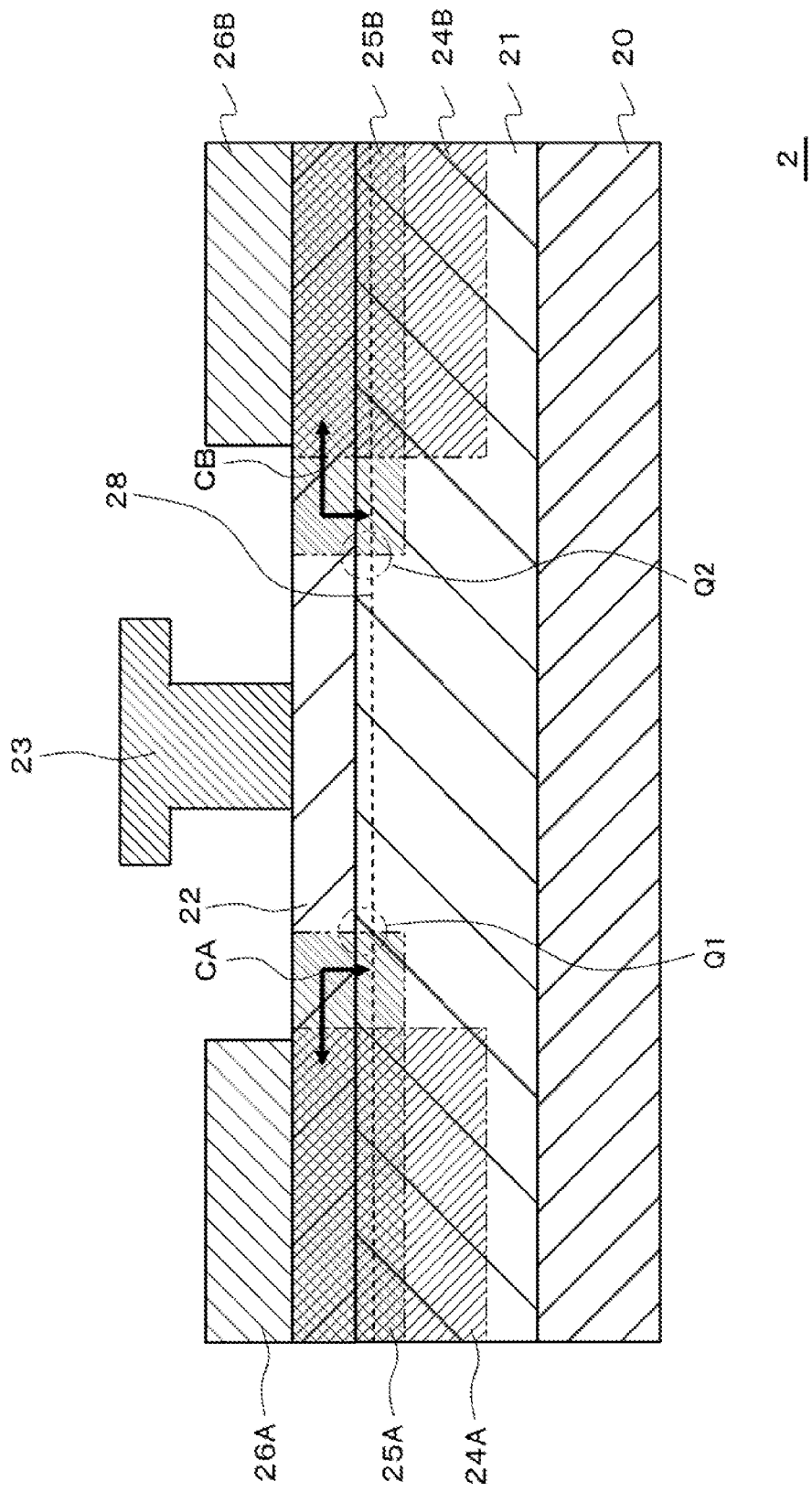
FIG. 4 is a diagram schematically illustrating a cross-sectional structure of GaN HEMT of the second embodiment.

As shown in FIG. 4, this HEMT 1 is configured so that an electron transit layer 21 formed of a III-nitride semiconductor is formed on a substrate 20, and an electron supply layer 22 formed of a III-nitride semiconductor forms a heterojunction with an upper surface of this electron transit layer 21. The electron transit layer 21 may be formed on the substrate 20 via a buffer layer (not shown). A band gap of the electron supply layer 22 is wider than that of the electron transit layer 21. A gate electrode 23, a source electrode 26A, and a drain electrode 26B are arranged on this electron supply layer 22.

The source electrode 26A and the drain electrode 26B are arranged so that the gate electrode 23 is sandwiched between them. Each of n-type conductive layer regions (n-type impurity implantation regions) 24A and 25A, extended from an upper part of the electron transit layer 21 to an upper surface of the electron supply layer 22, is formed below the source electrode 26A. Each of n-type conductive layer regions (n-type impurity implantation regions) 24B and 25B, extended from the upper part of the electron transit layer 21 to the upper surface of the electron supply layer 22, is formed below the drain electrode 26B. An n-type impurity concentration in each of the n-type conductive layer regions (n-type impurity implantation regions) 24A, 24B, 25A, and 25B is $1 \times 10^{20}$ cm$^{-3}$ or more. As well as in the first embodiment, a two-dimensional electron gas layer 28 is formed in the neighborhood of a heterojunction interface of the upper part of the electron transit layer 21 with the electron supply layer 22. The n-type conductive layer regions 24A, 25A, 24B, and 25B are formed with the depth from the upper surface of the electron supply layer 22 toward the two-dimensional electron gas layer 28. When this HEMT 2 is in on state, a channel region of the two-dimensional electron gas layer 28 is formed at the heterojunction interface of the electron transit layer 21 with the electron supply layer 22 and in the neighborhood thereof. The channel region of the two-dimensional electron gas layer 28 electrically connects between the n-type conductive layer regions 24A and 25A and between the n-type conductive layer regions 24B and 25B, whereby it becomes possible for a current to pass through the channel region.

As viewed from above the electron supply layer 22 (as viewed from above), the n-type conductive layer region 25A includes an n-type impurity conductive layer region 24A and is wider than the n-type conductive layer region 24A, so that it is projected from the gate electrode side of the n-type conductive layer region 24A. The n-type conductive layer region 25A is formed to the depth reaching the two-dimensional electron gas layer 28, and the depth is shallower than the n-type conductive layer region 24A. Similarly, as viewed from above the electron supply layer 22 (as viewed from above), the n-type conductive layer region 25B includes the n-type conductive layer region 24B and is wider than the n-type conductive layer region 24B, so that it is projected from the gate electrode side of the n-type conductive layer region 24B. The n-type conductive layer region 25B is formed to the depth reaching the two-dimensional electron gas layer 28, and the depth is less than the n-type conductive layer region 24B.

In the HEMT 2, components of the substrate 20, the electron transit layer 21, the electron supply layer 22, the source electrode 26A, the drain electrode 26B, and the gate electrode 23 may be identical to the respective components of the substrate 10, the electron transit layer 11, the electron supply layer 12, the source electrode 15A, the drain electrode 15B, and the gate electrode 14 in the first embodiment. It is preferred that an ionized donor impurity concentration (ionized n-type impurity concentration) at the heterojunction interface of an electron transit layer 21 part in each of the n-type conductive layer regions 24A, 24B, 25A, and 25B with the electron supply layer 22 is $1 \times 10^{19}$ cm$^{-3}$; or more under the above-mentioned temperature condition, for example. This makes it possible to obtain a low junction resistance at each of a junction part Q1 between the n-type conductive layer region 25A and a channel region that is below the gate electrode 23 and a junction part Q2 between the n-type conductive layer region 25B and the channel region, shown in FIGS. 3 and 4, as well as in the first embodiment. An access resistance, an on resistance, and the like can be reduced by the reduction of the junction resistance, for example.

A structure of the HEMT 2 of the present embodiment may be the same as that of the HEMT 1 of the first embodiment except that two n-type conductive layer regions 24A and 25A are formed on a source electrode side, and two n-type conductive layer regions 24B and 25B are formed on a drain electrode side. A mechanism of generating a two-dimensional electron gas (formation of the two-dimensional electron gas layer 28) and the like are also the same as described in the HEMT 1 of the first embodiment.

A method for producing the HEMT 2 of the present embodiment is not particularly limited, and the HEMT 2 can be produced, for example, in the same manner as the HEMT 1 of the first embodiment except that, in an n-type conductive layer region forming step, two-stage doping with an n-type impurity is conducted. The two-stage doping is described below.

First, the n-type conductive layer region (n-type impurity implnatation region) 24A can be formed by ion-implanting (first ion implantation) an n-type impurity such as Si into the source electrode formation planned region at relatively high acceleration energy $E_1$ (unit: keV) of, for example, about several hundred keV (first n-type impurity ion doping step). The ion implantation is conducted to relatively deep part so that a part in which a distribution of implanted ions becomes the maximum is deeper than where the two-dimensional electron gas layer 28 is. After this ion implantation, an n-type conductive layer region 25A is formed by further implanting (second ion implantation) an n-type impurity such as Si into a region including, as viewed from above the electron supply layer 22 (as viewed from above), the n-type conductive layer region 24A at relatively high acceleration energy $E_2$ ($E_1 > E_2$) of, for example, about several hundred keV (second n-type impurity ion doping step). The second ion implantation (second n-type impurity ion doping step) in the second n-type impurity ion doping step may be conducted so that a concentration (volume density) of an n-type impurity such as Si becomes $1 \times 10^{20}$ cm$^{-3}$ or more. It is preferred that the second ion implantation is conducted so that an effective dose amount of implanted ions of the n-type impurity becomes $5 \times 10^{15}$ cm$^{-2}$ or more at least at the heterojunction interface of the electron transit layer 21 part of the n-type conductive layer region 25A with the electron supply layer 22. The order of the first ion implantation (first n-type impurity ion doping step) and the second ion implantation (second n-type impurity ion doping step) is interchangeable according to circumstances of device production (HEMT production) and the like. It is possible to conduct the first ion implantation in the first n-type impurity ion doping step so that the n-type impurity concentration (volume density) in the n-type conductive layer region 24A becomes $1 \times 10^{20}$ cm$^{-3}$ or more, or an effective dose amount of the implanted ions of the n-type impurity becomes $5 \times 10^{15}$ cm$^{-2}$ or more. Each of n-type conductive layer regions 24B and 25B can be formed in the same manner as each of the n-type conductive layer regions 24A and 25A except that the source electron formation planned region is changed to the drain electrode formation planned region. Specifically, the n-type conductive layer regions 24B and 25B can be formed by the method including the first n-type impurity ion doping step and the second n-type impurity ion doping step as described above.

Figure 3:
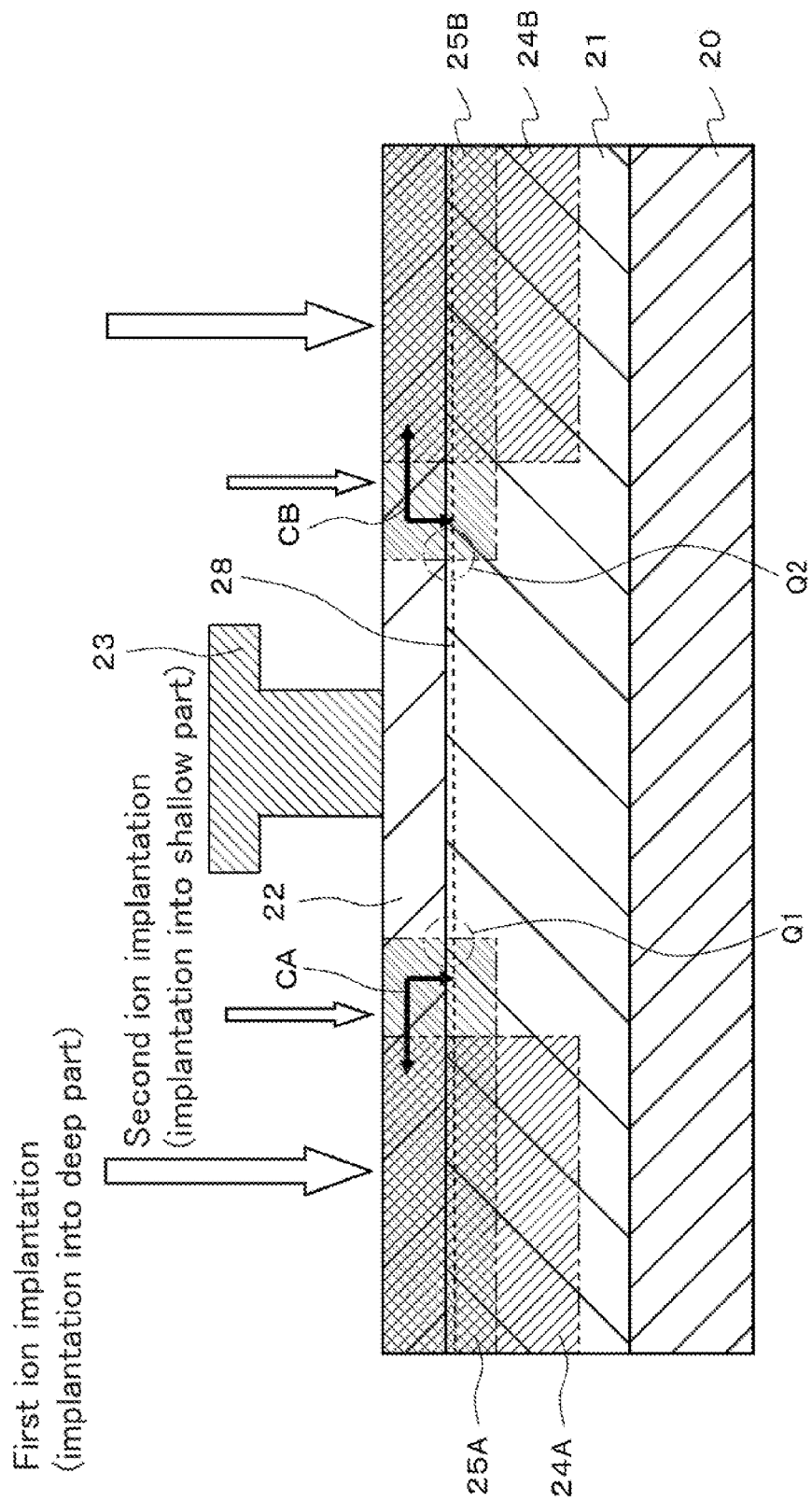
FIG. 3 is a cross-sectional view illustrating a production step in a second embodiment according to the present invention.

In the present embodiment, an n-type impurity is introduced into a deep part of the device by the first ion implantation, and thereafter, the second ion implantation is conducted. Thus, high-concentration impurity implantation regions 25A and 25B are formed. Electrical conduction properties of relatively low resistance are exhibited in a region between the high concentration impurity implantation regions 25A and 25B. Therefore, for example, it is possible to connect among the high concentration impurity implantation regions 25A and 25B and the two-dimensional electron gas layer 28 via current circuits CA and CB each with a low resistance, shown in FIGS. 3 and 4. In each of FIGS. 3 and 4, an arrow of the current circuit CA indicates a current circuit between the two-dimensional electron gas layer 28 and the source electrode 26A. As shown in FIGS. 3 and 4, the two-dimensional electron gas layer 28 includes a region of the n-type conductive layer region (high-concentration impurity implantation region) 25A, which is projected from the end on a gate electrode side of the n-type conductive layer region 24A. The current circuit CA is extended from this region in the two-dimensional electron gas 28 to the source electrode 26A through an inside of the electron supply layer 22 in the n-type conductive layer region (high-concentration impurity implantation region) 25A. Similarly, in each of FIGS. 3 and 4, an arrow of the current circuit CB indicates a current circuit between the two-dimensional electron gas layer 28 and the drain electrode 26B. As shown in FIGS. 3 and 4, the two-dimensional electron gas layer 28 includes a region of the n-type conductive layer region (high-concentration impurity implantation region) 25B, which is projected from the end on a gate electrode side of the n-type conductive layer region 24B. The current circuit CB is extended from this region in the two-dimensional electron gas 28 to the drain electrode 26B through an inside of the electron supply layer 22 in the n-type conductive layer region (high-concentration impurity implantation region) 25B.

In the production method of the present invention, as shown in the present embodiment, it is preferred that the doping with the n-type impurity ions in the n-type conductive layer region forming step includes a first n-type impurity ion doping step and a second n-type impurity ion doping step, a doping region in the second n-type impurity ion doping step includes an end on a gate electrode side of a doping region in the first n-type impurity ion doping step and is projected from the end on the gate electrode side, and a relationship between an acceleration energy $E_1$ of the doping with the n-type impurity ion in the first n-type impurity ion doping step and an acceleration energy $E_2$ of the doping with the n-type impurity ion in the second n-type impurity ion doping step satisfies $E_1 > E_2$. By such the two-stage doping, a current circuit with a low resistance can be formed between an ohmic electrode (source electrode or drain electrode) and a 2DEG layer, as mentioned above. According to such a two-stage doping, the n-type impurity can be easily implanted (doping with the n-type impurity) into a wide and deep range. For example, it is also possible that $n^+$ layers (high concentration impurity implantation regions) reaching to a deep part can be formed by the first ion implantation (first n-type impurity ion doping step), and a wide range of $n^+$ layers (high concentration impurity implantation regions) can be formed by the second ion implantation. Therefore, such a two-stage doping is suitable for, for example, an ion implantation in the case where the HEMT of the present invention is a vertical device.

An annealing treatment in the n-type conductive layer region forming step can be conducted in the same manner as in the first embodiment. Steps except the n-type conductive layer region forming step also can be conducted in the same manner as in the first embodiment, for example.

[Third Embodiment]

A third embodiment of the present invention is described. A part of the step of producing HEMT according to the present embodiment is shown in a cross-sectional view of FIG. 5. A cross-sectional structure of HEMT 3 of the present embodiment is schematically shown in a cross-sectional view of FIG. 6.

Figure 6:
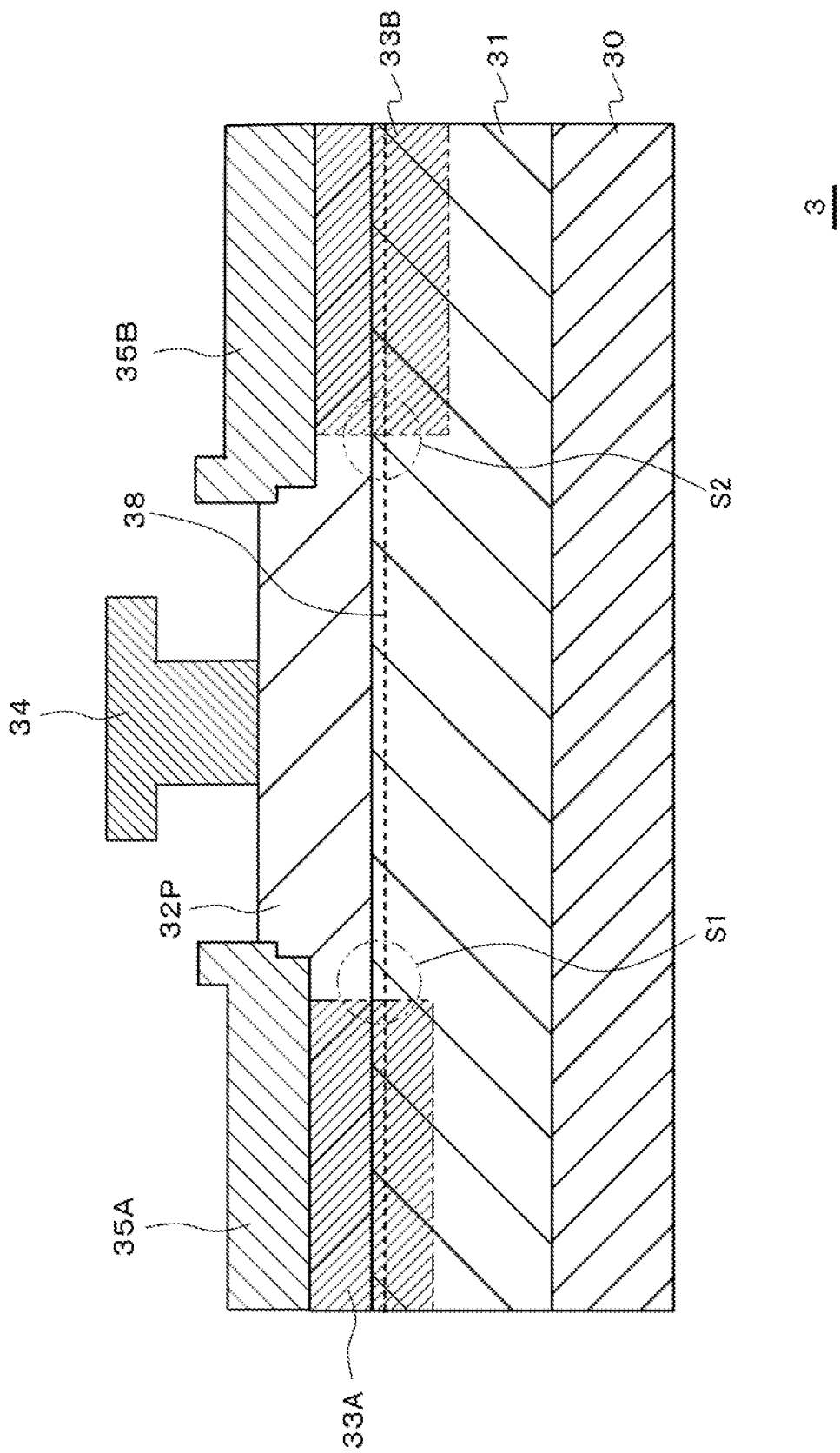
FIG. 6 is a diagram schematically illustrating a cross-sectional structure of GaN HEMT of the third embodiment.

As shown in FIG. 6, this HEMT 3 is configured so that an electron transit layer 31 formed of a III-nitride semiconductor is formed on a substrate 30, and an electron supply layer 32P formed of a III-nitride semiconductor forms a heterojunction with an upper surface of this electron transit layer 31. The electron transit layer 31 may be formed on the substrate 30 via a buffer layer (not shown). A band gap of the electron supply layer 32P is wider than that of the electron transit layer 31. A gate electrode 34, a source electrode 35A, and a drain electrode 35B are arranged on this electron supply layer 32P. Upper parts of a source electrode 35A formation region and a drain electrode 35B formation region in the electron supply layer 32P are removed, thereby being lower than a part of the electron supply layer 32P that has not been removed.

The source electrode 35A and the drain electrode 35B are arranged so that the gate electrode 34 is sandwiched between them. An n-type conductive layer region (n-type impurity implantation region) 33A extended from an upper part of the electron transit layer 31 to an upper surface of the electron supply layer 32P is formed below the source electrode 35A. An n-type conductive layer region (n-type impurity implantation region) 33B extended from the upper part of the electron transit layer 31 to the upper surface of the electron supply layer 32P is formed below the drain electrode 35B. An n-type impurity concentration in each of the n-type conductive layer regions (n-type impurity implantation regions) 33A and 33B is $1 \times 10^{20}$ cm$^{-3}$ or more. As well as in the first embodiment, a two-dimensional electron gas layer 38 is formed in the neighborhood of a heterojunction interface of the upper part of the electron transit layer 31 with the electron supply layer 32P. The n-type conductive layer regions 33A and 33B with the depth from the upper surface of the electron supply layer 32P toward the two-dimensional electron gas layer 38 are formed. When this HEMT 3 is in on state, a channel region of the two-dimensional electron gas layer 38 is formed at the heterojunction interface of the electron transit layer 31 with the electron supply layer 32P and in the neighborhood thereof. The channel region of the two-dimensional electron gas layer 38 electrically connects between the n-type conductive layer regions 33A and 33B, whereby it becomes possible for a current to pass through the channel region. As shown in FIG. 6, in this HEMT 3, the source electrode 35A is formed so that it covers the entire upper surface of the n-type conductive layer region 33A, and the drain electrode 35B is formed so that it covers the entire upper surface of the n-type conductive layer region 33B. The source electrode 35A is projected from the end on a gate electrode side of an upper surface of the n-type conductive layer region 33A, and the drain electrode 35B is projected from the end on a gate electrode side of an upper surface of the n-type conductive layer region 33B.

In the HEMT 3, components of the substrate 30, the electron transit layer 31, the electron supply layer 32P, the source electrode 35A, the drain electrode 35B, and the gate electrode 34 may be identical to the respective components of the substrate 10, the electron transit layer 11, the electron supply layer 12, the source electrode 15A, the drain electrode 15B, and the gate electrode 14 in the first embodiment. It is preferred that an ionized donor impurity concentration (ionized n-type impurity concentration) at the heterojunction interface of an electron transit layer 31 part in each of the n-type conductive layer regions 33A and 33B with the electron supply layer 32P is $1 \times 10^{19}$ cm$^{-3}$ or more under the above-mentioned temperature condition, for example. This makes it possible to obtain a low junction resistance at each of a junction part S1 between the n-type conductive layer region 33A and a channel region that is below the gate electrode 34 and a junction part S2 between the n-type conductive layer region 33B and the channel region, shown in FIGS. 5 and 6, as well as in the first embodiment. An access resistance, an on resistance, and the like can be reduced by the reduction of the junction resistance, for example.

A structure of the HEMT 3 of the present embodiment may be the same as that of the HEMT 1 of the first embodiment except that the structure of the electron supply layer is different, and the source electrode and the drain electrode are formed so that they cover the entire upper surfaces of the n-type conductive layer regions. A mechanism of generating a two-dimensional electron gas (formation of the two-dimensional electron gas layer 38) and the like are also the same as described in the HEMT 1 of the first embodiment.

Figure 5:
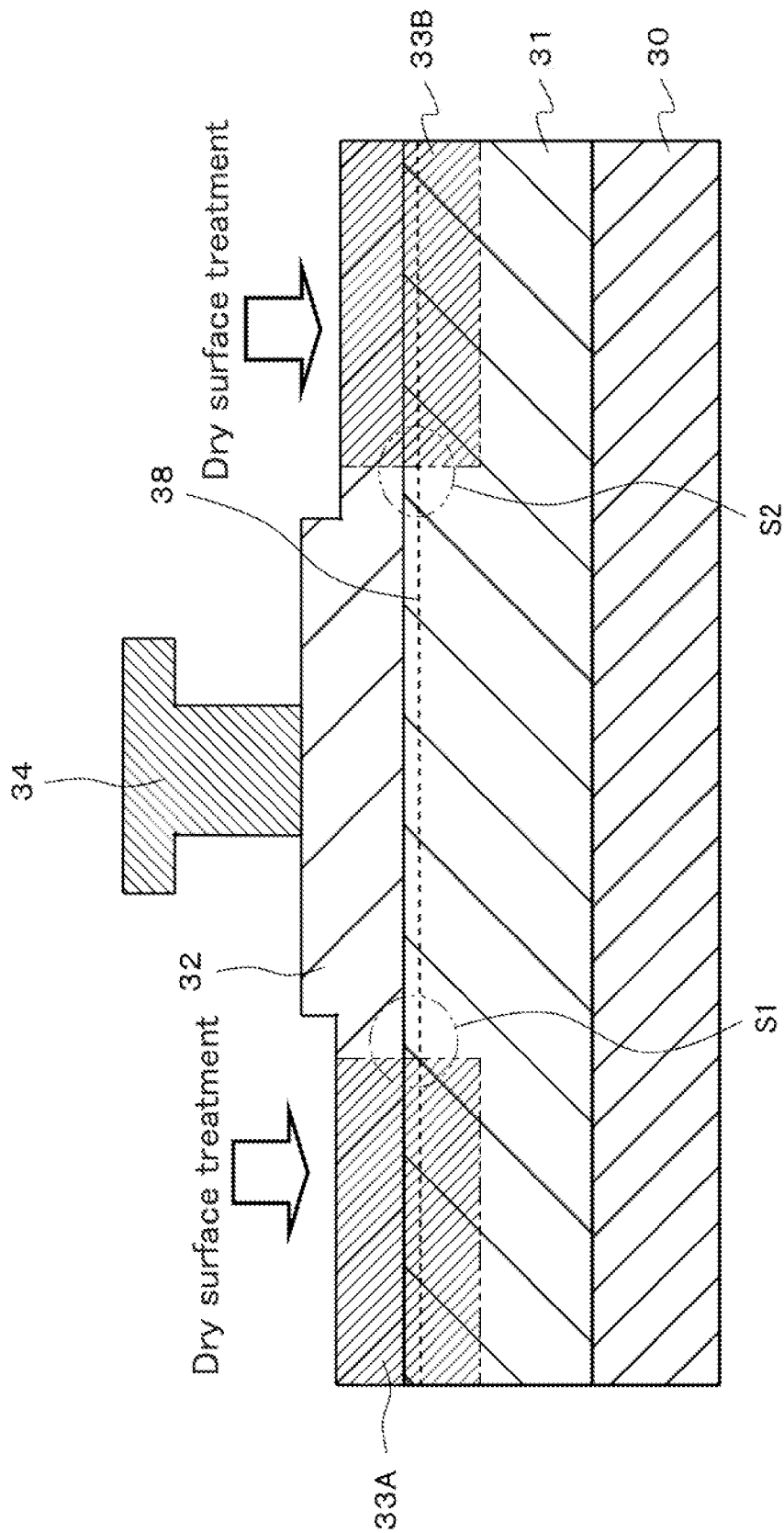
FIG. 5 is a cross-sectional view illustrating a production step in a third embodiment according to the present invention.

A method for producing the HEMT 3 of the present embodiment is not particularly limited. For example, the HEMT 3 can be produced in the same manner as HEMT 1 of the first embodiment except that upper surfaces of n-type conductive layer regions 33A and 33B are subjected to a dry surface treatment, and a source electrode 35A and a drain electrode 35B are formed so that they cover entire upper surfaces of the n-type conductive layer regions 33A and 33B. That is, first, in the same manner as in the first embodiment, an electron transit layer 31 formed of a III-nitride semiconductor is formed on a substrate 30 (electron transit layer forming step), and then, an electron supply layer 32 (FIG. 5) is formed through formation of a heterojunction between an upper surface of the electron transit layer 31 and a III-nitride semiconductor (electron supply layer forming step). Thereafter, in the same manner as in the first embodiment, the n-type conductive layer regions 33A and 33B are formed by doping with an n-type impurity and annealing (n-type conductive layer region forming step). After the formation of the n-type conductive layer regions 33A and 33B, a gate electrode 34 having a T-shaped cross-sectional shape is formed in the same manner as the gate electrode 14 (FIG. 1) of the first embodiment (gate electrode forming step). Subsequently, as shown in FIG. 5, upper surfaces of the n-type conductive layer regions 33A and 33B in the electron supply layer 32 are subjected to a dry surface treatment by exposing them with a plasma gas. Thus, as shown in FIG. 6, an electron supply layer 32P that has been processed (that has been subjected to a dry surface treatment) is formed. The dry surface treatment may be, for example, dry etching. A plasma gas used in the dry etching is not particularly limited, and examples thereof include $SF_6$ (sulfurhexafluoride), $CF_4$ (tetrafluoromethane), $CHF_3$ (trifluoromethane), and $C_2F_6$ (hexafluoroethan). The gate electrode forming step may be conducted before or after the dry surface treatment.

By the same steps as a source electrode 15A forming step and a drain electrode 15B forming step of the first embodiment, a source electrode 35A and a drain electrode 35B (ohmic electrodes) being in ohmic contact with the n-type conductive layer regions 33A and 33B, respectively, are formed (source electrode forming step and drain electrode forming step). In this way, the HEMT 3 of FIG. 6 can be produced.

The electron supply layer 32 (FIG. 5) is damaged when an n-type impurity ion implantation is conducted in order to form the n-type conductive layer regions 33A and 33B, for example. However, the damage to the electron supply layer 32 is reduced by subjecting the upper surfaces of the n-type conductive layer regions 33A and 33B to a dry surface treatment, so that the electron supply layer 32 becomes the electron supply layer 32P (FIG. 6). Thus, a contact resistance between the source electrode 35A and the electron supply layer 32 is reduced, and a contact resistance between the drain electrode 35B and the same is also reduced. As a result, favorable contacts between the ohmic electrode 35A and the electron supply layer 32P of a III-nitride semiconductor and between the ohmic electrode 35B and the same can be formed.

It is preferred that the method for producing the HEMT 3 of the present invention further include a dry surface treatment step of conducting a dry surface treatment by exposing upper surfaces of the n-type conductive layer regions after the n-type conductive layer region forming step with a plasma gas as shown in the present embodiment, for example. It is more preferred that, in the dry surface treatment step, a dry surface treatment to an upper surface of the source electrode formation planned region is conducted prior to the source electrode forming step, and a dry surface treatment to an upper surface of the drain electrode formation planned region is conducted prior to the drain electrode forming step. For example, as mentioned above, damage to the electron supply layer is reduced by the dry surface treatment, whereby a favorable crystal structure can be obtained. In the present invention, the "dry surface treatment" refers to a treatment conducted without a contact of a liquid with a surface, and examples thereof include dry etching and exposure to plasma. The plasma gas is not particularly limited and may be, for example, a gas generally used for dry etching or the like. Specific examples of the plasma gas include $SF_6$ (sulfur hexafluoride), $CF_4$ (tetrafluoromethane), CHF, (trifluoromethane), and $C_2F_6$ (hexafluoroethan).

In the HEMT 3 of the present embodiment, as shown in FIG. 6, the source electrode 35A is formed so that it covers the entire upper surface of the n-type conductive layer region 33A and is projected from the end on a gate electrode side of the upper surface of the n-type conductive. Further, the drain electrode 35B is formed so that it covers the entire upper surface of the n-type conductive layer region 33B and is projected from the end on a gate electrode side of the upper surface of the n-type conductive layer region 33B. Polarization charges on upper surfaces of the n-type conductive layer regions can be compensated by covering the entire surfaces thereof. Therefore, carriers of the two-dimensional electron gas layer 38 at junction parts S1 and S2 with a channel are recovered so as to satisfy an electroneutrality condition, whereby a junction resistance at each of the junction parts S1 and S2 is further reduced. When the upper surfaces of the n-type conductive layer regions 33A and 33B are exposed, polarization charges (negative polarization charges in the case of AlGaN/GaN-HEMT) at exposed surfaces is not compensated, whereby a carrier concentration of the two-dimensional electron gas layer 38 at each of the junction parts S1 and S2 is reduced. The entire upper surfaces of the n-type conductive layer regions 33A and 33B are preferably covered because a reduction in carrier concentration can be prevented. In the present embodiment, the source electrode 35A and the drain electrode 35B each functions as a protective film by completely covering the upper surfaces of the n-type conductive layer regions (donor impurity ion implantation regions) 33A and 33B with them, whereby carriers at each of the junction parts S1 and S2 can be recovered.

For the above-described reason, it is preferred that, in the HEMT of the present invention, the source electrode and the drain electrode are formed so that they cover the entire upper surfaces of the n-type conductive layer regions. It is more preferred that each of the source electrode and the drain electrode is projected from the end on a gate electrode side of each of the n-type conductive layer regions as shown in FIG.

6 because the polarization charges at the end on the gate electrode side (each of the junction parts with a channel region) are more easily compensated.

In the dry surface treatment step of the HEMT production method of the present invention, it is preferred that regions to be subjected to the dry surface treatment includes the entire upper surfaces of the respective n-type conductive layer regions. This makes it possible to yet more easily reduce the junction resistance at each junction part (boarder) between each of the n-type conductive layer regions and the channel region. From the viewpoint of the above-mentioned compensation of polarization charges, it is preferred that the source electrode and the drain electrode are formed so that they cover the entire upper surfaces of the n-type conductive layer regions in the source electrode forming step and the drain electrode forming step.

[Fourth Embodiment]

Figure 7:
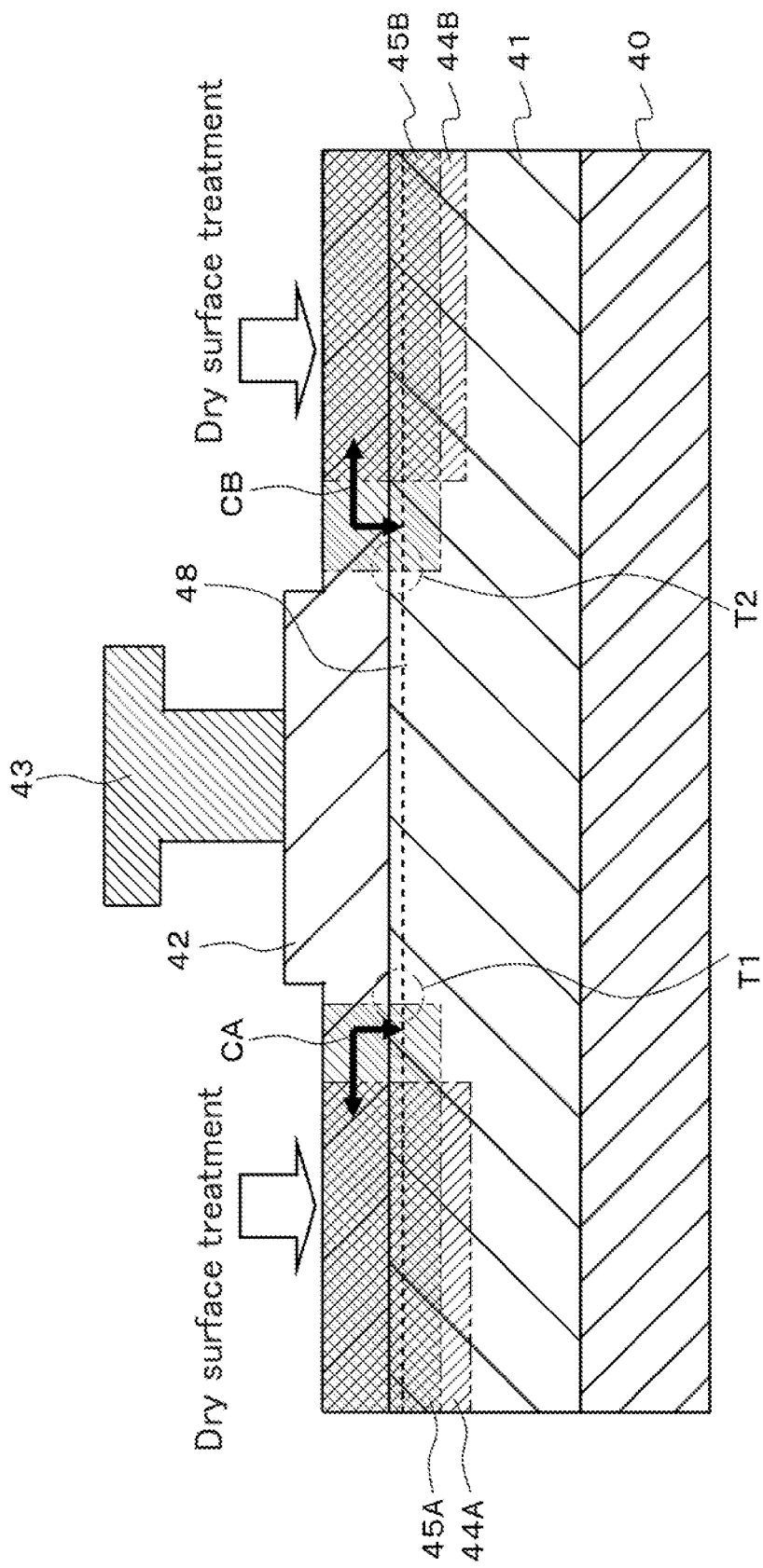
FIG. 7 is a cross-sectional view illustrating a production step in a fourth embodiment according to the present invention.

A fourth embodiment of the present invention is described. A part of the step of producing HEMT according to the present embodiment is shown in a cross-sectional view of FIG. 7. A cross-sectional structure of HEMT 4 of the present embodiment is schematically shown in a cross-sectional view of FIG. 8.

Figure 8:
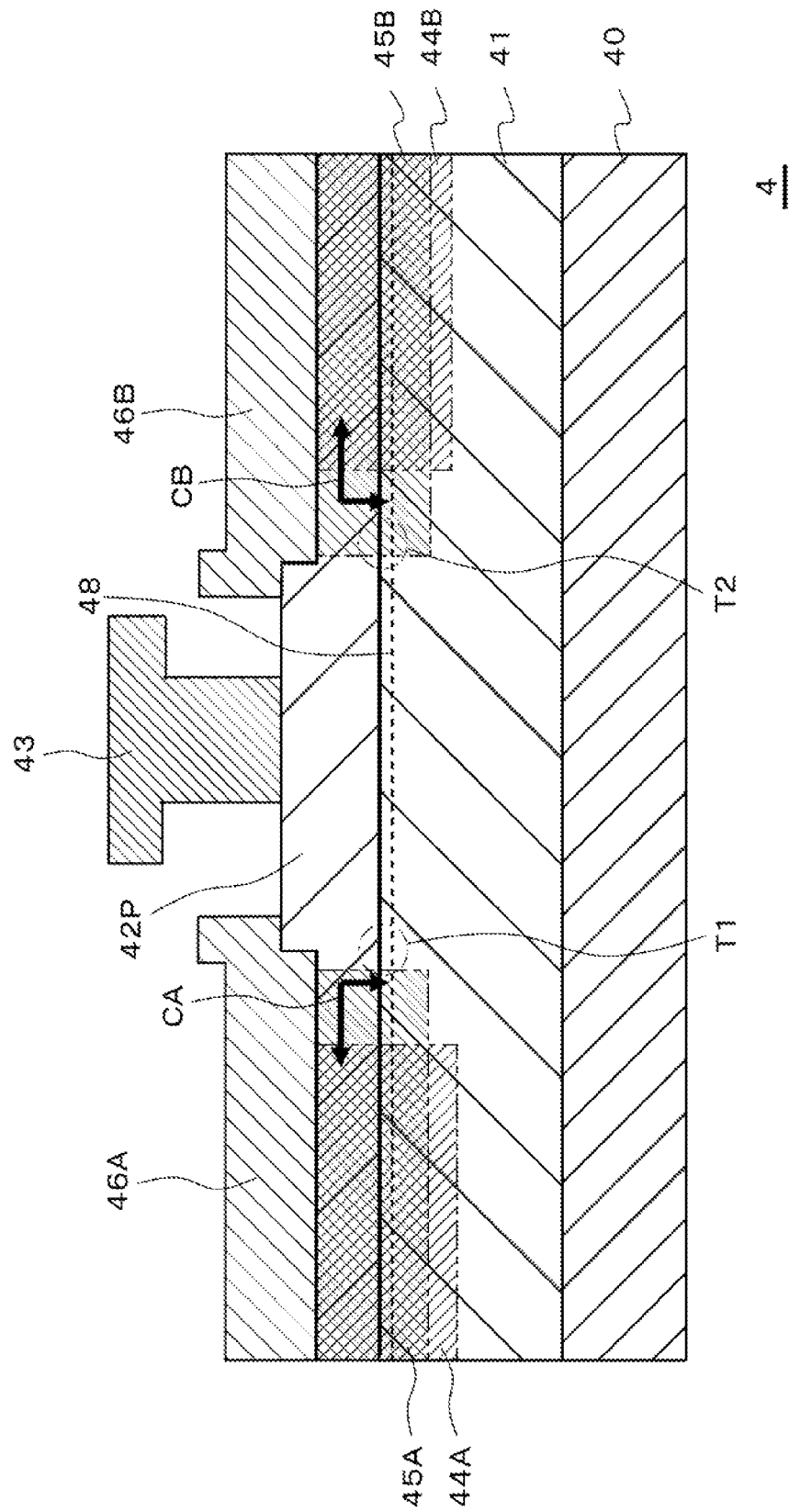
FIG. 8 is a diagram schematically illustrating a cross-sectional structure of GaN HEMT of the fourth embodiment.

As shown in FIG. 8, this HEMT 4 is configured so that an electron transit layer 41 formed of a III-nitride semiconductor is formed on a substrate 40, and an electron supply layer 42P formed of a III-nitride semiconductor forms a heterojunction with an upper surface of this electron transit layer 41. The electron transit layer 41 may be formed on the substrate 40 via a buffer layer (not shown). A band gap of the electron supply layer 42P is wider than that of the electron transit layer 41. A gate electrode 43, a source electrode 46A, and a drain electrode 46B are arranged on this electron supply layer 42P. Upper parts of a source electrode 46A formation region and a drain electrode 46B formation region in the electron supply layer 42P are removed, thereby being lower than a part of the electron supply layer 42P that has not been removed.

The source electrode 46A and the drain electrode 46B are arranged so that the gate electrode 43 is sandwiched between them. Each of n-type conductive layer regions (n-type impurity implantation regions) 44A and 44B, extended from an upper part of the electron transit layer 41 to an upper surface of the electron supply layer 42P is formed below the source electrode 46A. Each of n-type conductive layer regions (n-type impurity implantation regions) 44B and 45B, extended from the upper part of the electron transit layer 41 to the upper surface of the electron supply layer 42P is formed below the drain electrode 46B. An n-type impurity concentration in each of the n-type conductive layer regions (n-type impurity implantation regions) 44A, 45A, 44B, and 45B is $1 \times 10^{20}$ cm$^{-3}$ or more. As well as in the first embodiment to the third embodiment, a two-dimensional electron gas layer 48 is formed in the neighborhood of a heterojunction interface of the upper part of the electron transit layer 41 with the electron supply layer 42P. The n-type conductive layer regions 44A, 45A, 44B, and 45B with the depth from the upper surface of the electron supply layer 42P toward the two-dimensional electron gas layer 48 are formed. When this HEMT 4 is in on state, a channel region of the two-dimensional electron gas layer 48 is formed at the heterojunction interface of the electron transit layer 41 with the electron supply layer 42P and in the neighborhood thereof. The channel region of the two-dimensional electron gas layer 48 electrically connects between the n-type conductive layer regions 44A and 45A and between the n-type conductive layer regions 44B and 45B, whereby it becomes possible for a current to pass through the channel region. As shown in FIG. 8, in this HEMT 4, the source electrode 46A is formed so that it covers the entire upper surface of the n-type conductive layer region 45A, and the drain electrode 46B is formed so that it covers the entire upper surface of the n-type conductive layer region 45B. The source electrode 46A is projected from the end on a gate electrode side of an upper surface of the n-type conductive layer region 45A, and the drain electrode 46B is projected from the end on a gate electrode side of an upper surface of the n-type conductive layer region 45B.

As viewed from above the electron supply layer 42P (as viewed from above), the n-type conductive layer region 45A includes the n-type impurity conductive layer region 44A and is wider than the n-type conductive layer region 44A, so that it is projected from the gate electrode side of the n-type conductive layer region 44A. The n-type conductive layer region 45A is formed to the depth reaching the two-dimensional electron gas layer 48, and the depth is shallower than the n-type conductive layer region 44A. Similarly, as viewed from above the electron supply layer 42P (as viewed from above), the n-type conductive layer region 45B includes the n-type conductive layer region 44B and is wider than the n-type conductive layer region 44B, so that it is projected from the gate electrode side of the n-type conductive layer region 44B. The n-type conductive layer region 45B is formed to the depth reaching the two-dimensional electron gas layer 48, and the depth is less than the n-type conductive layer region 44B.

In the HEMT 4, components of the substrate 40, the electron transit layer 41, the electron supply layer 42P, the source electrode 46A, the drain electrode 46B, and the gate electrode 43 may be identical to the respective components of the substrate 40, the electron transit layer 41, the electron supply layer 42P, the source electrode 45A, the drain electrode 45B, and the gate electrode 44 in the first embodiment. It is preferred that an ionized donor impurity concentration (ionized n-type impurity concentration) at the heterojunction interface of an electron transit layer 21 part in each of the n-type conductive layer regions 44A, 44B, 45A, and 45B with the electron supply layer 42 is $1 \times 10^{19}$ cm$^{-3}$ or more under the above-mentioned temperature condition, for example. This makes it possible to obtain a low junction resistance at each of a junction part T1 between the n-type conductive layer region 45A and a channel region that is below the gate electrode 43 and a junction part T2 between the n-type conductive layer region 45B and the channel region, shown in FIGS. 7 and 8, as well as in the first embodiment to the third embodiment. An access resistance, an on resistance, and the like can be reduced by the reduction of the junction resistance, for example.

As described above, the structure of each of the n-type conductive layer regions in the HEMT 4 of the present embodiment is the same as that of the HEMT 2 of the second embodiment. The point that upper surfaces of the n-type conductive layer regions 45A and 45B are subjected to a dry surface treatment (dry etching), so that damage to the electron supply layer 42 (FIG. 7) is reduced, whereby the electron supply layer 42 becomes the electron supply layer 42P (FIG. 8) is the same as in the third embodiment. The point that the source electrode 46A is formed so that it covers the entire upper surface of the n-type conductive layer region 45A and is projected from the end on a gate electrode side of the upper surface of the n-type conductive layer region 45A is the same as in the third embodiment. The point that the drain electrode 46B is formed so that it covers the entire upper surface of the n-type conductive layer region 45B and is projected from the end on a gate electrode side of the upper surface of the n-type conductive layer region 45B is also the same as in the third embodiment. As described above, the HEMT 4 of the present embodiment has both of the characteristic structures described in the second embodiment and the third embodiment. Thus, it exerts both of the effects described in the HEMT 2 of the second embodiment and the HEMT 3 of the third embodiment. The respective effects brought about by the HEMT 2 of the second embodiment and the HEMT 3 of the third embodiment are described in the second embodiment and the third embodiment. The structures other than the above-described characteristic structures may be identical to those of the first embodiment to the third embodiment. A mechanism of generating a two-dimensional electron gas (formation of a two-dimensional electron gas layer 48) and the like are also the same as described in the HEMT 1 to HEMT 3 of the first embodiment to the third embodiment.

A method for producing the HEMT 4 of the present embodiment is not particularly limited and is, for example, as follows. That is, first, an electron transit layer 41 formed of a III-nitride semiconductor is formed on a substrate 40 (electron transit layer forming step), and then, an electron supply layer 42 is formed through formation of a heterojunction between an upper surface of the electron transit layer 41 and a III-nitride semiconductor (electron supply layer forming step). These steps can be conducted in the same manner as in the first embodiment to third embodiment. Then, the n-type conductive layer regions 44A, 44B, 45A, and 45B are formed (n-type conductive layer region forming step). In this n-type conductive layer region forming step, two-stage doping with an n-type impurity is conducted. The doping can be conducted in the same manner as in the second embodiment, for example. An annealing treatment can be conducted in the same manner as in the first embodiment to the third embodiment, for example. Thereafter, a gate electrode 43 is formed on an upper surface of the electron supply layer 42 (gate electrode forming step). This gate electrode forming step can be conducted in the same manner as in the first embodiment to the third embodiment. Subsequently, the upper surfaces of the n-type conductive layer regions 45A and 45B are subjected to a dry surface treatment (dry etching) by exposing them to a plasma gas, whereby the electron supply layer 42 becomes the electron supply layer 42P that has been processed (subjected to a dry surface treatment) (dry surface treatment step). This dry surface treatment step can be conducted in the same manner as in the third embodiment, for example. The gate electrode forming step may be before or after the dry surface treatment step. By the same steps as the source electrode 15A forming step and a drain electrode 15B forming step in the first embodiment, a source electrode 46A (ohmic electrode) being in ohmic contact with the n-type conductive layer region 45A and a drain electrode 46B (ohmic electrode) being in ohmic contact with the n-type conductive layer region 45B are formed (source electrode forming step and drain electrode forming step). Thus, the HEMT 4 of FIG. 8 can be produced.

[Properties of HEMT of the Present Invention]

Hereinafter, results obtained by examining the HEMT of the present invention such as the HEMT 1 described in the first embodiment to HEMT 4 described in the fourth embodiment through experiments and the like are shown below. Note here that the following data is illustrative, and the present invention is not limited thereto.

In each of the HEMT 1 of the first embodiment to the HEMT 4 of the fourth embodiment, each of an electron transit layer and an electron supply layer can be formed of a III-nitride semiconductor. Specifically, as mentioned above, there is an AlGaN/GaN heterojunction structure in which the electron transit layer is formed of GaN, and the electron supply layer is formed of AlGaN, for example. A polarizing effect is generated at an heterojunction interface of AlGaN/GaN that are grown on a gallium (Ga)-face or an aluminum (Al)-face (or a nitrogen (N)-face), which is a characteristic of the nitride semiconductor material. Therefore, at the AlGaN/GaN heterojunction interface, carriers having a high sheet charge concentration Ns with the order of $10^{13}$ cm$^{-2}$ that is 5 times greater than that at the GaAs-type AlGaAs/GaAs heterojunction interface can be formed. A HEMT device having such an AlGaN/GaN heterojunction structure can achieve superior properties such as a high current value and a high output electric power. Note here that, as mentioned above, a structure including the electron transit layer and the electron supply layer in the HEMT of the present invention is not limited to only the AlGaN/GaN heterojunction structure.

A dopant species in order to selectively form n$^+$-type conductive layers (n-type conductive layer regions) by an ion implantation into the HEMT (having the AlGaN/GaN heterojunction structure, for example) of the present invention is not particularly limited, and for example, various dopant species used for a general HEMT can be used. Among these dopant species, Si (atomic weight: 28) is particularly preferred. In the HEMT of the present invention, the thickness of the electron supply layer (for example, an AlGaN layer) is not particularly limited, and is, for example, from 15 to 45 nm. When the electron supply layer is the AlGaN layer, the composition thereof is not particularly limited and includes Al with a composition ratio thereof from 0.15 to 0.20. When Si (atomic weight: 28) is ion-implanted into an AlGaN/GaN heterojunction HEMT structure having this profile, the ion implantation can be conducted by an implantation through a through film, for example. In the case of using a general semiconductor device, the ion implantation can be conducted at the acceleration energy from 30 to 120 keV and with the dose amount from $1 \times 10^{14}$ to $3 \times 10^{15}$ cm$^{-2}$. In the present invention, as mentioned above, by setting the dose, amount to, for example, $5 \times 10^{15}$ cm$^{-2}$ or more, a donor impurity (n-type impurity) concentration can be high, and a contact resistance, an access resistance, an on resistance, and the like can be reduced. After the ion implantation, activation annealing is conducted, for example, at about 1200° C. in order to activate doping ions.

In the present invention, the "composition" refers to a quantitative relationship between the numbers of atoms of elements composing a semiconductor layer and the like. The "composition ratio" refers to a relative ratio between the number of atoms of a specific element composing the semiconductor layer or the like and the number of atoms of the other elements composing the same. For example, in a semiconductor layer having a composition represented by $Al_xGa_{1-x}N$, a value of x refers to an "Al composition ratio". In the present invention, in the case where a composition and a composition ratio of a semiconductor layer are specified, an impurity (dopant) in order to express conductivity and the like is not regarded as an element composing the semiconductor layer. For example, although an impurity (dopant) in a p-type GaN layer and that in an n-type GaN layer are different from each other, the composition of the p-type GaN layer and that of the n-type GaN layer are identical to each other. The composition of the n-type GaN layer and that of an n$^+$GaN layer with a high impurity concentration as compared with the n-type GaN layer are identical to each other.

A 80 nm-thick nitride film (SiN film) as a through film was deposited on an $Al_{0.15}Ga_{0.85}N$ (with a thickness of 45 mm)/GaN heterojunction epi structure (epitaxial structure). Then Si ($^{28}$Si) with a dose amount (including an amount to be absorbed into the through film) of $1 \times 10^{15}$ cm$^{-2}$ was ion-implanted via this through film at an acceleration energy of 100 keV. Thereafter, activation annealing was conducted at 1200° C. for 3 minutes. Ohmic electrodes are formed on this resultant structure by metalizing with a Ti/Al/Nb/Au multi-layer film. Electronic properties of the resultant element were measured using a hall measurement method and a TLM (Transmission Line Model) method.

Figure 9:
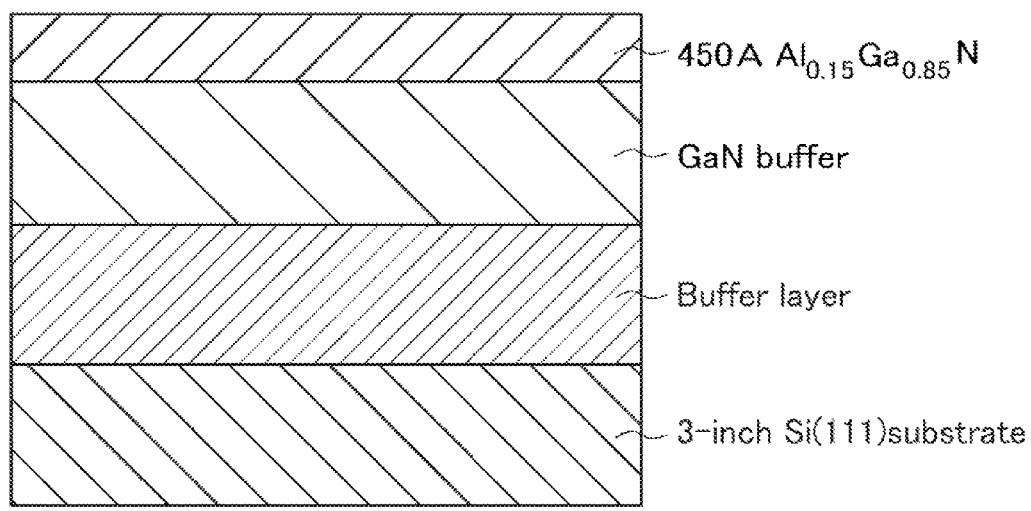
FIG. 9 is a diagram schematically showing an example of an epi structure.
Figure 10:
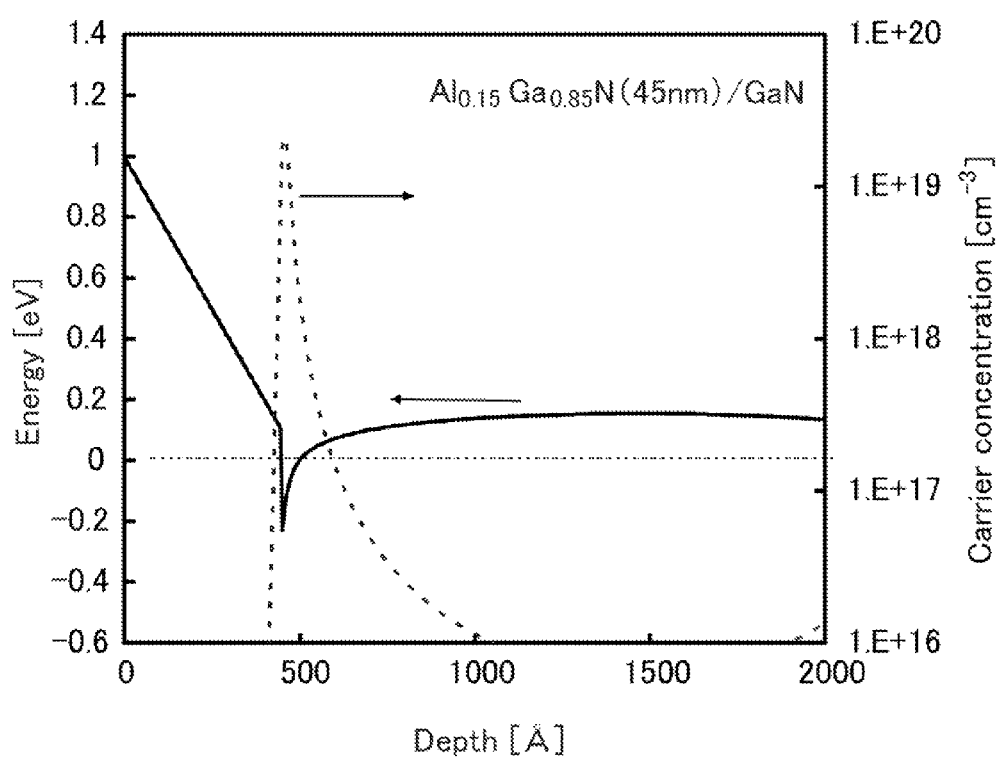
FIG. 10 is a graph illustrating a result obtained by calculating a band structure in an epi structure shown in FIG. 9.

FIG. 9 is a diagram schematically showing an epi structure of this element. FIG. 10 is a graph showing a result obtained by calculating a band structure in the epi structure shown in FIG. 9. In the graph of FIG. 10, a horizontal axis indicates a depth of the epi structure. 1 Å is equal to $10^{-10}$ m, i.e., 0.1 nm. In FIG. 10, a vertical axis on a left side of the graph indicates energy on the conduction band, and a vertical axis on a right side of the same indicates a carrier concentration. A reference value (0 eV) on the vertical axis on the left side is equal to a Fermi level. A graph drawn with a solid line shows an energy distribution in the depth direction, and a graph drawn with a dashed line shows a carrier concentration distribution in the depth direction.

As shown in FIG. 10, it was found that energy on a conduction band was lower than the Fermi level in the neighborhood (with the depth slightly exceeding 450 Å (45 nm)) of a heterojunction interface of the GaN layer with the AlGaN layer, and carriers (electrons) were concentrated in the neighborhood. These electrons can serve as a two-dimensional electron gas (2DEG).

Figure 11:
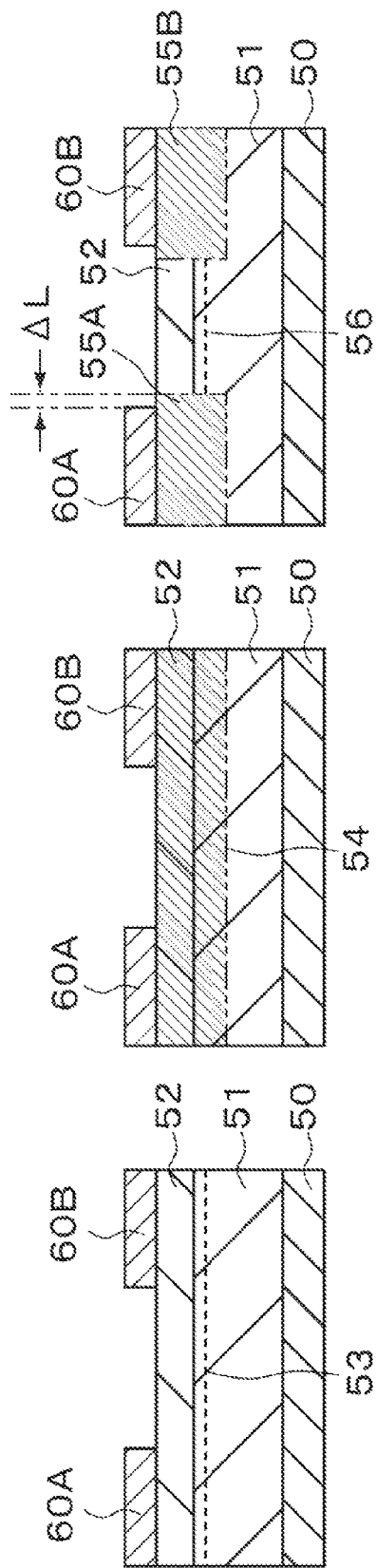
FIGS. 11A, 11B, and 11C are cross-sectional views schematically illustrating three types of heterojunction structures.

Next, the respective three types of structures shown in FIGS. 11A, 11B, and 11C were provided and subjected to a measurement by a TLM method. The TLM method is basically a two-terminal measurement, and therefore, in these test patterns, a gate electrode was not provided.

The structure of FIG. 11A includes a substrate 50, a buffer film (not shown), an electron transit layer (GaN layer) 51 formed on the substrate 50 via the buffer film, an electron supply layer (AlGaN layer) 52 forming a heterojunction with the electron transit layer 51, and a source electrode 60A and a drain electrode 60B each being in an ohmic contact with an upper surface of this electron supply layer 52. When this structure is in on state, a two-dimensional electron gas layer 53 is formed. However, this epi structure is a structure of normally on, whereby the epi structure is in on state under the state of no control electrode unless a control electrode (gate electrode) is provided, and a negative control signal (negative gate bias) is applied thereto.

The structure of FIG. 11B includes a substrate 50, a buffer film (not shown), an electron transit layer (GaN layer) 51 formed on the substrate 50 via the buffer film, an electron supply layer (AlGaN layer) 52 forming a heterojunction with an upper surface of the electron transit layer 51, and a source electrode 60A and a drain electrode 60B each being in ohmic contact with an upper surface of the electron supply layer 52. In this structure, an n$^+$-type impurity implantation region 54 with a high n$^+$-type impurity concentration from the upper surface of the electron supply layer 52 to a depth exceeding a heterojunction interface is formed by ion implantation The structure of FIG. 11C includes a substrate 50, a buffer film (not shown), an electron transit layer (GaN layer) formed on the substrate 50 via the buffer film, an electron supply layer (AlGaN layer) 52 forming a heterojunction with an upper surface of the electron transit layer 51, and a source electrode 60A and a drain electrode 60B each being in ohmic contact with an upper surface of the electron supply layer (AlGaN layer) 52. An n$^+$-type impurity implantation region 55A with a high n$^+$-type impurity concentration from the upper surface of the electron supply layer 52 to a depth exceeding the heterojunction interface is formed below the source electrode by ion implantation. An n$^+$-type impurity implantation region 55B with a high n$^+$-type impurity concentration from the upper surface of the electron supply layer 52 to a depth exceeding the heterojunction interface is formed below the drain electrode by ion implantation. When this structure is in on state, a channel 56 of a two-dimensional electron gas layer is formed between the n$^+$-type impurity implantation regions 55A and 55B.

The structure of FIG. 11A is a structure to determine an ohmic contact resistance Rc (2DEG) and a sheet resistance Rsh (2DEG) of the two-dimensional electron gas layer 53 in a region not to be subjected to an ion implantation. The ohmic contact resistance of the two-dimensional gas refers to an electric resistance between the two-dimensional electron gas and an ohmic electrode, and the sheet resistance of the two-dimensional gas refers to an electric resistance of a two-dimensional electron gas transit layer (part of an upper part of an electron transit layer, on which a two-dimensional electron gas is transited).

The structure of FIG. 11B is a structure to determine an ohmic contact resistance Rc (n) and a sheet resistance Rsh (n) in a region not to be subjected to an ion implantation. The structure of FIG. 11C is a structure to evaluate a junction resistance Rb at each of a junction part between the n$^+$-type impurity implantation region (n-type conductive layer region) 55A and a channel 56 of a two-dimensional electron gas layer that is between the n$^+$-type impurity implantation regions 55A and 55B and a junction part between the n$^+$-type impurity implantation region (n-type conductive layer region) 55B and the channel. The sheet resistance in the structure of FIG. 11C is equal to the sheet resistance Rsh (2DEG) of the structure of FIG. 11A. On the other hand, an apparent contact resistance Rc† evaluated in the structure of FIG. 11C is represented by the following formula (1) with consideration given to a margin ΔL of each of the junction parts in the structure of FIG. 11C. The margin ΔL of each of the junction parts is a width of a part of each of the n$^+$-type impurity implantation regions (n-type conductive layer regions) 55A and 55B, on upper part of which an ohmic electrode is not formed. The width is a width in the direction in which a current is passed through between the source electrode and the drain electrode.

$$Rc\dagger = Rb + Rc(n) + Rsh(n) \cdot \Delta L \quad (1)$$

In the formula (1), Rc (n) and Rsh (n) can be determined from FIG. 11B, and ΔL is known, whereby the junction resistance Rb at each of the junction parts between the n$^+$-type impurity implantation region 55A and the channel 56 and between the n$^+$-type impurity implantation region 55B and the channel 56 can be determined by this formula. In the HEMT of the present invention, the junction resistance Rb is preferably 0.3 Ωmm or less, more preferably 0.2 Ωmm or less, and particularly preferably 0.1 Ωmm or less. The lower limit of the junction resistance Rb is not particularly limited. In the HEMT of the present invention, the ohmic contact resistance Rc (n) is preferably 0.3 Ωmm or less, more preferably 0.2 Ωmm or less, and particularly preferably 0.1 Ωmm or less. The lower limit of the ohmic contact resistance Rc (n) is not particularly limited. In the HEMT of the present invention, the sheet resistance Rsh (n) is preferably 100 Ω/square or less, more preferably 70 Ω/square or less, and particularly preferably 50 Ω/square or less. The lower limit of the sheet resistance Rsh (n) is not particularly limited.

In each of FIGS. 11A to 11C, a 45 mm-thick Al$_{0.15}$Ga$_{0.85}$N layer that is the same as used in the element described in FIGS. 9 and 10 was used as an electron supply layer 52. A GaN layer that is the same as used in the element described in FIGS. 9 and 10 was used as an electron transit layer 51. In a region doped with an n-type impurity (Si), doping and annealing were conducted under the same condition as used in the element described in FIGS. 9 and 10, and the dose amount was set to $1\times10^{15}$ cm$^{-2}$. Ohmic electrodes were also the same as used in the element described in FIGS. 9 and 10.

Properties obtained by the evaluation were that a contact resistance satisfied Rc=0.47 Ωmm, and a sheet resistance satisfied 408 Ω/square (ohm/square) in each of the n$^+$-type impurity implantation regions 55A and 55B of the element (test pattern) of FIG. 11C. A problem in the element is a junction resistance between each of the n$^+$-type impurity implantation regions 55A and 55B and a channel 56, and the result obtained by measuring this junction resistance was, as mentioned below, 116 times (1.16 Ωmm) higher than in the case where the dose amount (including an amount to be absorbed into a through film) is $1\times10^{11}$ cm$^{-2}$. This junction resistance as a contact resistance causes increases in an access resistance, an on resistance, and the like in a device. Therefore, it is important to reduce this junction resistance.

The results obtained by examination of dependency of the junction resistance between a channel 56 and each of the n$^+$-type impurity implantation regions 55A and 55B to a dose amount of an n-type impurity through experiments and the like are shown below.

First, in the element (sample) described in FIG. 9, An n-type impurity ($^{28}$Si) was ion-implanted (doping) with changes in dose amount within a range from $1\times10^{11}$ (1E+11) to $3\times10^{16}$ (3E+16) cm$^{-2}$, and a correlation between the dose amount and the implanted n-type impurity concentration ($^{28}$Si) was checked. The acceleration energy at the time of the ion implantation was a constant value of 100 keV, and the thickness of a through film of SiN was also a constant value (80 nm). Results are shown in a graph of FIG. 12. In FIG. 12, a horizontal axis indicates a depth (nm) from an upper surface of an electron supply layer (AlGaN layer) 52, while a vertical axis indicates a concentration (cm$^{-3}$) of an n-type impurity implanted into each depth shown in FIG. 10. In FIG. 10, a region with a negative depth indicates the through film of SiN. As shown in FIG. 10, accompanying an increase in dose amount, the concentration of the n-type impurity ($^{28}$Si) implanted into each depth is also increased. The "dose amount" shown in FIG. 10 is a value from which an amount to be absorbed into the through film of SiN has not been subtracted, and the effective dose amount is about 8% lower than the value shown in FIG. 10.

Figure 13:
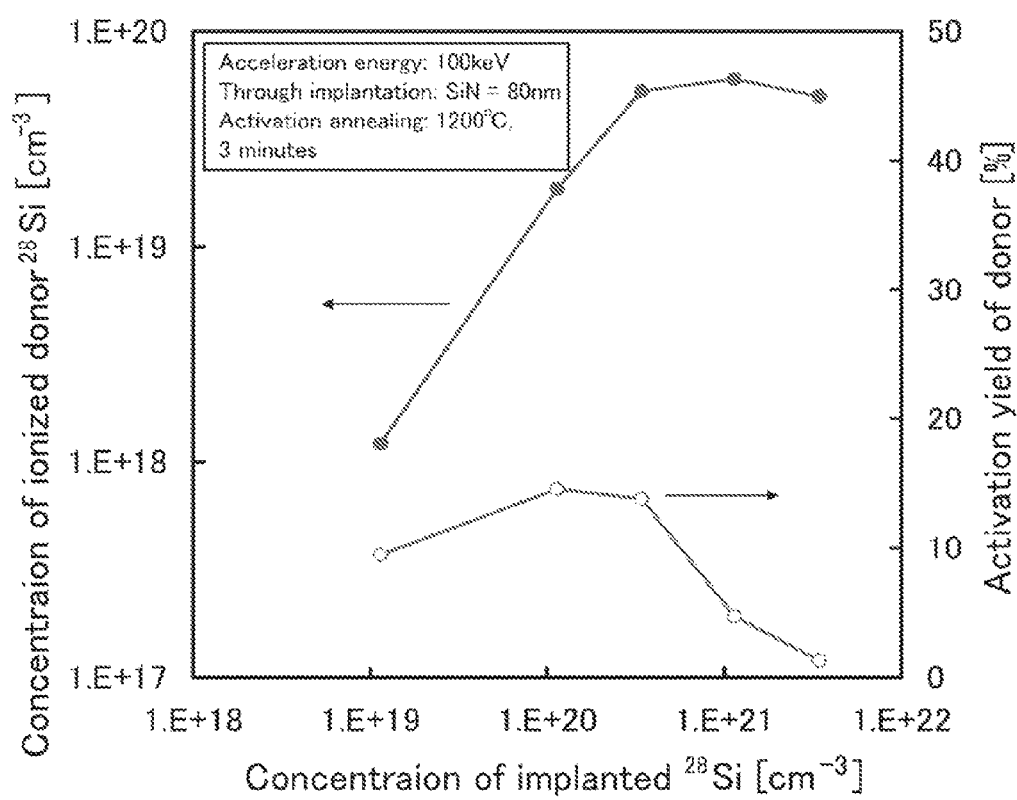
FIG. 13 is a graph illustrating a relationship between a concentration of implanted ions and a concentration of an ionized donor impurity.

Under the doping conditions shown in FIG. 12, a correlation between a implanted donor (n-type impurity, $^{28}$Si) concentration and a ionized donor concentration of the donor that has been ionized at room temperature (25° C.) at the heterojunction interface of the electron transit layer (GaN layer) 51 with the electron supply layer (AlGaN layer) 52 was checked. Activation (annealing treatment) of the donor (n-type impurity, $^{28}$Si) was conducted at 1200° C. ×3 minutes. The result obtained by plotting the ionized donor concentration with respect to the concentration of ion-implanted $^{28}$Si at the heterojunction interface is shown in a graph of FIG. 13. In FIG. 13, a horizontal axis indicates a concentration of $^{28}$Si implanted into the heteroiunction interface, a vertical axis on a left side indicates a concentration of the donor ($^{28}$Si) that has been ionized at the above-described temperature, and a vertical axis on a right side indicates an activation yield (ionization rate) of the donor ($^{28}$Si) at the above-described temperature. As shown in FIG. 13, when a donor (n-type impurity) concentration was $1\times10^{20}$(1E+20)/cm$^3$ or more, a sufficient ionized donor concentration (ionized n-type impurity concentration), exceeding $1\times10^{19}$ (1E+19)/cm$^3$ was obtained. The ionized donor concentration was at the maximum in a region of the ionized donor (n-type impurity) concentration from $3\times10^{20}$ (3E20) to $3\times10^{21}$ (3E21)/cm$^3$. When the implanted donor concentration became higher than $3\times10^{21}$/cm$^3$, the ionized donor concentration was slightly reduced. The reason of this is not always clear and is considered that the ionized donor concentration reached a saturated concentration (solubility limit) in AlGaN or GaN, for example. As described above, from the viewpoint of further increasing the ionized n-type impurity concentration, it is preferred that, in the HEMT of the present invention, the n-type impurity concentration at the heterojunction interface of the electron transit layer part in each of the n-type conductive layer regions with the electron supply layer is $3\times10^{20}$ cm$^{-3}$ or more. The upper limit of the n-type impurity concentration is not particularly limited, and is, for example $3\times10^{21}$ cm$^{-3}$ or less for the above-mentioned reason.

Figure 14:
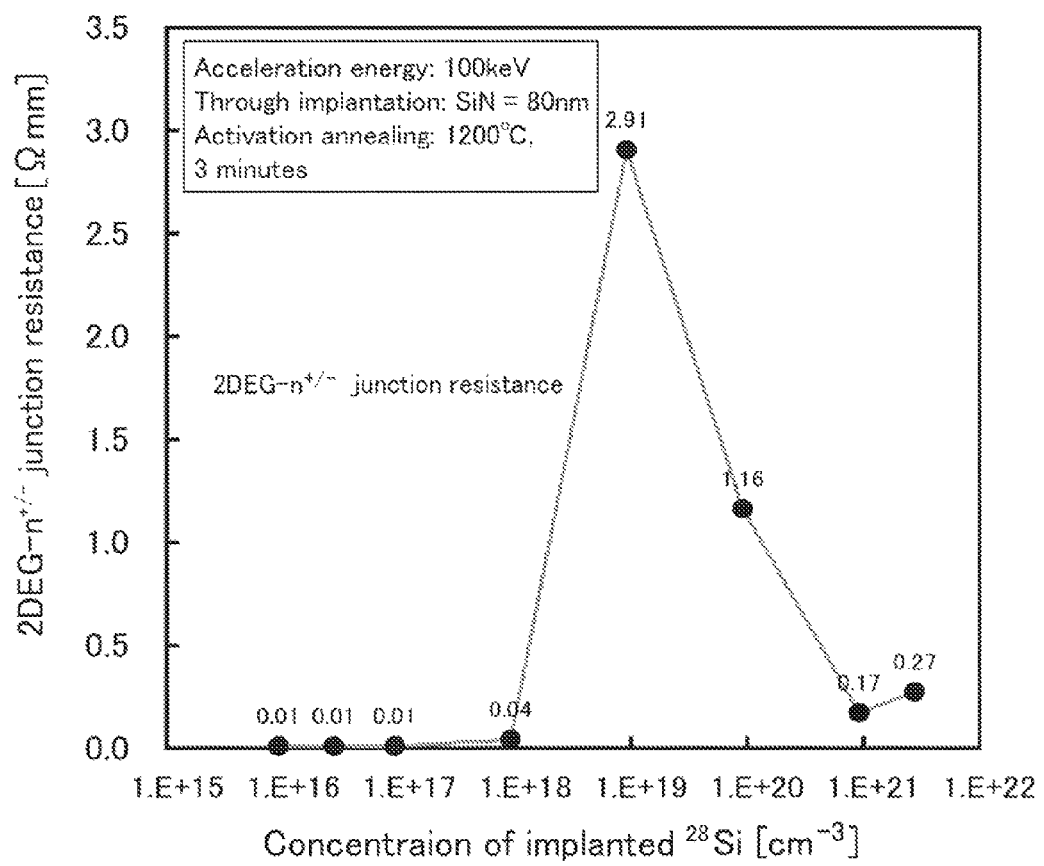
FIG. 14 is a graph illustrating a relationship of a junction resistance between 2DEG and an n$^+$ layer with a concentration of an n-type impurity.

Next, in the element of FIG. 11C, a correlation of a junction resistance Rb between a channel 56 and each of the n$^+$-type impurity implantation regions 55A and 55B with an n-type impurity concentration ("implanted $^{28}$Si concentration" on the horizontal axis shown in FIG. 13) at the heterojunction interface was examined. The doping conditions were the same as shown in FIGS. 12 and 13. A graph obtained by plotting the results is shown in FIG. 14. In FIG. 14, a horizontal axis (implanted $^{28}$Si concentration) indicates a $^{28}$Si (n-type impurity) concentration at the heterojunction interface. A vertical axis (2DEG-n$^{+/-}$ junction resistance) indicates a junction resistance Rb [Ωmm] between a channel 56 and each of the n$^+$-type impurity implantation regions 55A and 55B.

Figure 15:
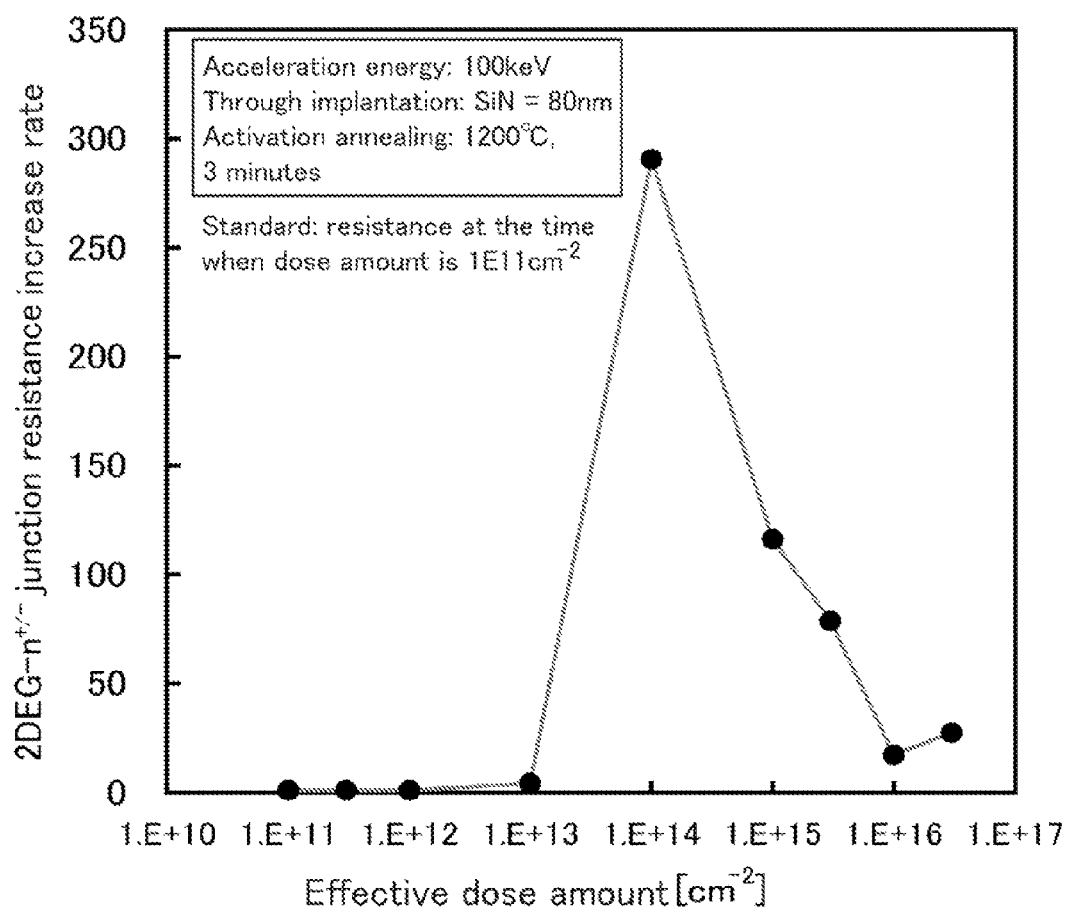
FIG. 15 is a graph illustrating a correlation between an effective dose amount and a junction resistance.

The junction resistance on the vertical axis shown in FIG. 14 was represented by a junction resistance increase rate and was plotted with respect to an effective dose amount of an n-type impurity as substitute for a $^{28}$Si (n-type impurity) concentration. Results are shown in FIG. 15. In FIG. 15, the horizontal indicates an effective dose amount at the time of doping with $^{28}$Si (n-type impurity) (under the same doping conditions as in FIGS. 12 and 13. The vertical axis (2DEG-n$^{+/-}$ junction resistance increase rate) indicates a resistance obtained by normalizing a junction resistance Rb [Ωmm] between a channel 56 and each of the n$^+$-type impurity implantation regions 55A and 55B based on a junction resistance at the time where the dose amount (including an amount to be absorbed into the through film) is $1\times10^{11}$(1E+11) cm$^{-2}$.

Figure 16:
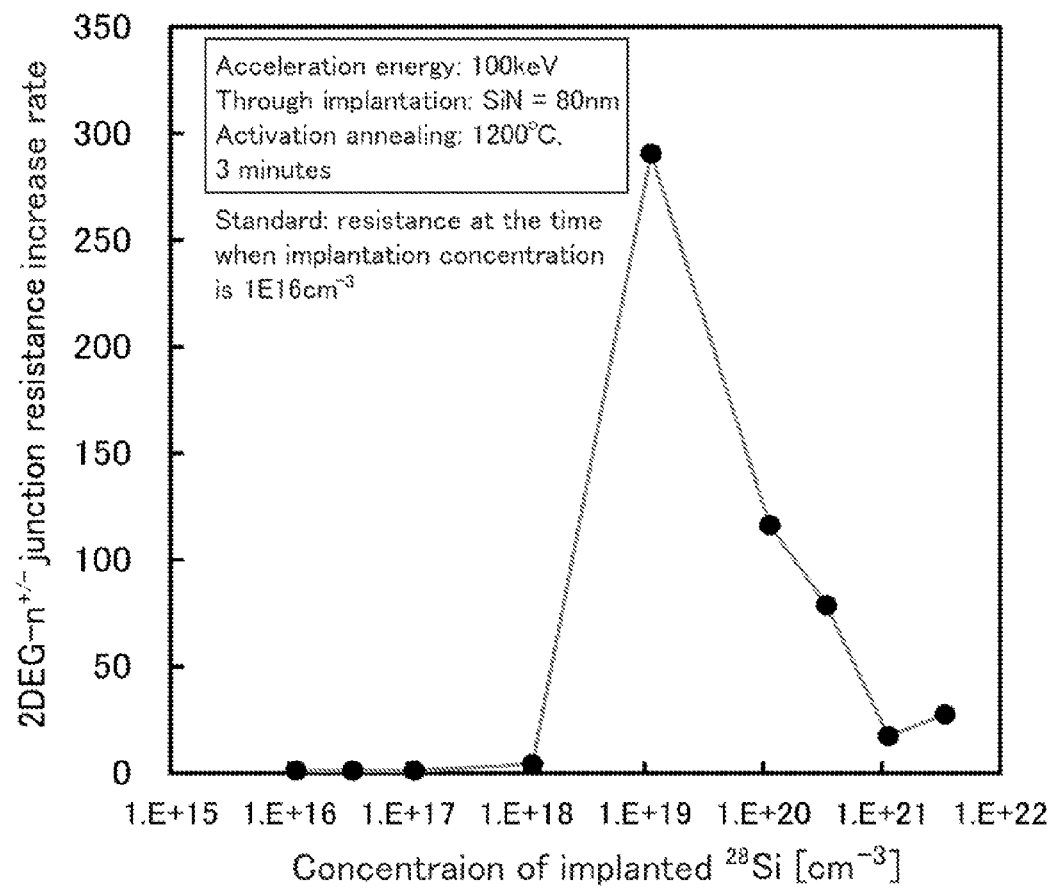
FIG. 16 is a graph illustrating a correlation between a concentration (volume density) of a donor impurity and a junction resistance.

On the graph of FIG. 16, a correlation between the junction resistance increase rate and a concentration of $^{28}$Si (n-type impurity) that has been implanted into the heterojunction interface was plotted. In FIG. 16, the horizontal axis (implanted $^{28}$Si concentration) indicates a $^{28}$Si (n-type impurity) concentration at the heterojunction interface, as well as in FIG. 14. The vertical axis (2DEG-n$^{+/-}$ junction resistance increase rate) indicates a resistance obtained by normalizing a junction resistance Rb [Ωmm] between a channel 56 and each of the n$^+$-type impurity implantation regions 55A and 55B based on a junction resistance at the time when the dose amount (including an amount to be absorbed into the through film) is $1\times10^{11}$(1E+11) cm$^{-2}$, as well as in FIG. 15.

As shown in FIGS. 14 to 16, when the n-type impurity concentration at the heterojunction interface of the electron transit layer part in each of the n-type conductive layer regions with the electron supply layer is $1\times10^{20}$ (1E+20) cm$^{-3}$ or more, or the effective dose amount is $1\times10^{15}$ (1E+15) cm$^{-2}$ or more, the junction resistance Rb (2DEG-n$^{+/-}$ junction resistance) was significantly reduced. As shown in FIGS. 14 and 16, when the n-type impurity concentration at the heterojunction interface was in the range from $8\times10^{20}$ (8E+20) to $3\times10^{21}$ (3E+21) cm$^{-3}$, the junction resistance Rb (2DEG-n$^{+/-}$ junction resistance) was particularly low (0.15 mm or less). In this case, an on resistance of the HEMT also can be reduced to the extent of suitable specifically for practical use. From this viewpoint, the n-type impurity concentration at the heterojunction interface of the electron transit layer part in each of the n-type conductive layer regions with the electron supply layer in the HEMT of the present invention is more preferably $8 \times 10^{20}$ cm$^{-3}$ or more, and the upper limit thereof is preferably $3 \times 10^{21}$ cm$^{-3}$. The upper limit is not particularly limited and may exceed $3 \times 10^{21}$ cm$^{-3}$. However, when the n-type impurity is present in large excess, there is a risk to increase the junction resistance Rb because of the degradation of the above-mentioned crystal structure and the like.

As shown in FIGS. 14 and 16, the junction resistance Rb was slightly increased in the region of the $^{28}$Si (n-type impurity) concentration at the heterojunction interface of $1 \times 10^{18}$ (1E+18) cm$^{-2}$ or less. Similarly, it can be seen from FIG. 15 that the junction resistance Rb was slightly increased in the region of the effective dose amount of $1 \times 10^{13}$ (1E13) cm$^{-2}$ or less. That is, it is considered that since the amount of implanted ions (n-type impurity) reaching to the heterojunction interface is small in the region of the effective dose amount of $1 \times 10^{13}$ (1E13) cm$^{-2}$ or less, the heterojunction interface is maintained in the state before the ion implantation. Therefore, in this region of the effective dose amount or this region of the donor impurity (n-type impurity) concentration, effect of reductions in contact resistance and sheet resistance generated due to an implantation of donor impurity ions (n-type impurity) is originally small.

As shown in FIGS. 14 to 16, the junction resistance (junction resistance increase rate) was at the maximum at the point where the effective dose amount was just $1 \times 10^{14}$ cm$^{-2}$ or the point where the $^{28}$Si (n-type impurity) concentration was $1 \times 10^{19}$ (1E+19) cm$^{-3}$. The reason of this is considered that, for example, an atom arrangement in a channel part of the heterointerface in a semiconductor was damaged by ion implantation, and a potential at the channel part was increased, whereby the potential became a barrier to the electric conduction. Note here that this is an example of assumable mechanism and do not limit the present invention. The inventors of the present invention focused on that when the effective dose amount of an n-type impurity or the n-type impurity concentration (volume density) at the heterojunction interface is a certain value, the junction resistance becomes extremely large. Then, the inventors of the present invention found out that the n-type impurity concentration at the heterojunction interface is set to $1 \times 10^{20}$ cm$^{-3}$ or more in order to solve this and reached to the present invention. The inventors of the present invention further found out that the effective dose amount of the n-type impurity is set to $1 \times 10^{15}$ cm$^{-2}$ in order to solve this.

As shown in the graph of FIG. 15, the junction resistance Rb was a minimum value at the point where the dose amount was $1 \times 10^{16}$ (1E+16) cm$^{-2}$ in a region of the effective dose amount from $1 \times 10^{14}$ (1E+14) to $3 \times 10^{16}$ (3E+16) cm$^{-2}$. This value is suitable specifically for a device application because the lower the junction resistance Rb the better. The dose amount of $1 \times 10^{16}$ (1E+16) cm$^{-2}$ with which this minimum junction resistance was obtained is an optimal or nearly optimal dose amount in order to reduce the junction resistance Rb between the channel 56 and each of the n$^+$-type impurity implantation regions 55A and 55B. The dose amount of $1 \times 10^{16}$ (1E+16) cm$^{-2}$ is an amount introduced via a through film, and the effective dose amount (dose amount reached below the upper surface of the electron supply layer via the through film is $9.2 \times 10^{15}$ (9.2E+15) cm$^{-2}$. As described above, in the region of relatively high effective dose amount, an increase in junction resistance Rb can be suppressed to a sufficiently low value. As shown in FIG. 15, there was a tendency to slightly increase the junction resistance when the effective dose amount exceeds $3 \times 10^{16}$ (3E16) cm$^{-2}$. The reason of this is not always clear and is, however, considered that the ionized donor concentration reached a saturated concentration (solubility limit) in AlGaN or GaN with this dose amount or more, for example. From this viewpoint, in the HEMT production method of the present invention, the effective dose amount in each of the n-type conductive layer regions is preferably $9.2 \times 10^{15}$ cm$^{-2}$ or more, and more preferably $1.0 \times 10^{16}$ cm$^{-2}$ or more. The upper limit of the effective dose amount is not particularly limited and is preferably $3 \times 10^{16}$ (3E16) cm$^{-2}$ or less for the above-described reason.

Figure 17:
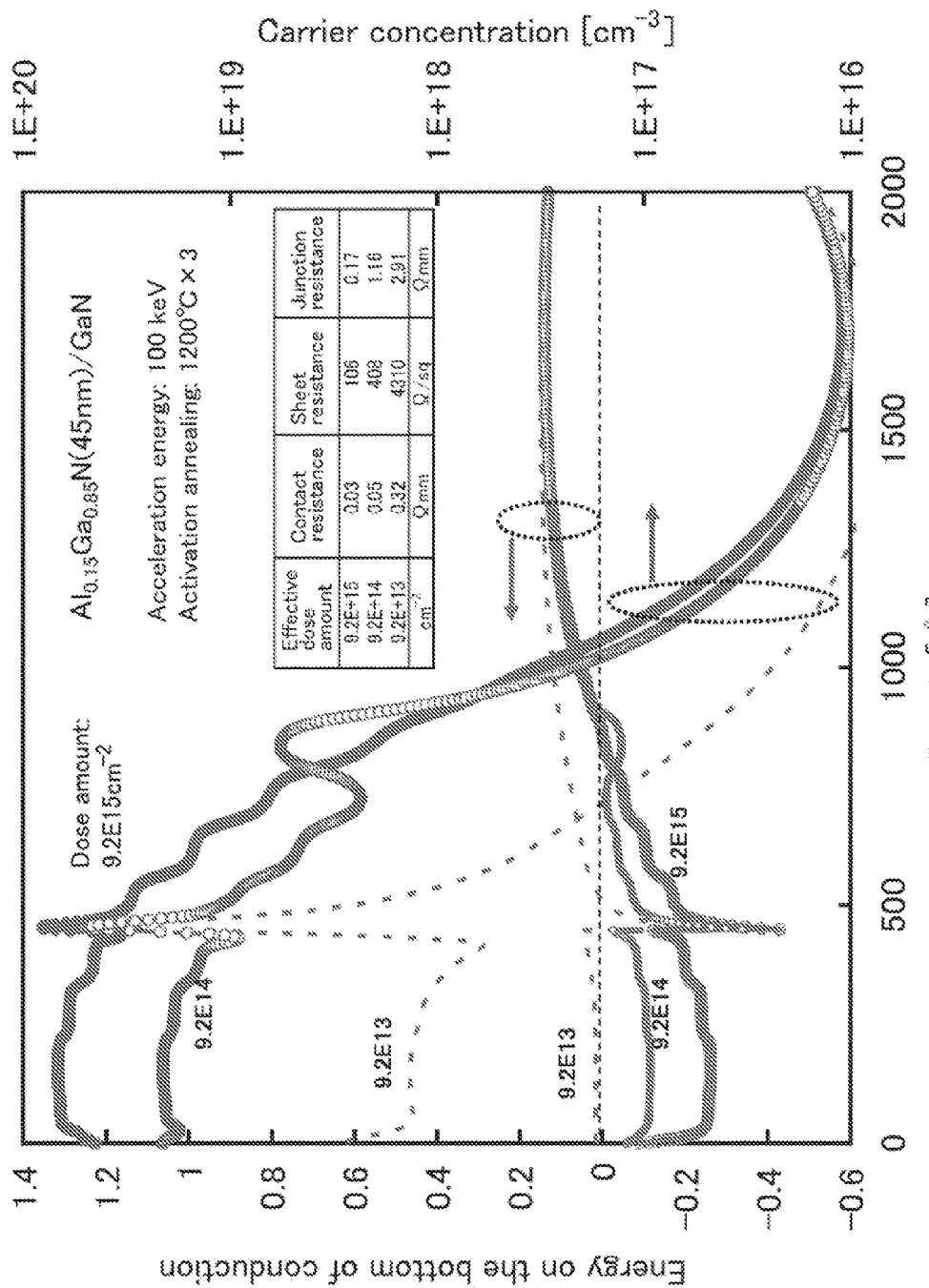
FIG. 17 is a graph obtained by plotting energy on the bottom of a conduction band of each sample with respect to a depth.

Studies on mechanism of reducing the junction resistance Rb were further carried out. A self consistent solution is determined by solving simultaneous equations of the Schrödinger's equation and the Poisson's equation through a numerical calculation, and a quantitative one-dimensional band structure having a quantum-mechanical effect was determined. Results of this calculation are shown in FIG. 17. Specifically, FIG. 17 is a graph obtained by plotting energy on the bottom of the conduction band of a sample or a carrier concentration (electron concentration) in the depth direction with various changes in effective dose amount to an element (sample) shown in each of FIGS. 11 to 16. In FIG. 17, values obtained by gradually increasing the effective dose amount to $9.2 \times 10^{13}$ (9.2E13) cm$^{-2}$, $9.2 \times 10^{14}$ (9.2E14) cm$^{-2}$, and $9.2 \times 10^{15}$ (9.2E15) cm$^{-2}$ were plotted. In FIG. 17, the horizontal axis indicates a depth (Å) from the upper surface of the electron supply layer 52 in the element (sample). 1 Å is equal to $10^{-10}$ m, i.e., 0.1 nm. In FIG. 17, the vertical axis indicates energy (eV) on the bottom of the conduction band of the sample or a carrier concentration (cm$^{-3}$). In FIG. 17, the carrier refers to an electron. The carrier concentration is equal to the ionized n-type impurity (donor impurity, $^{28}$Si) concentration. In FIG. 17, a distribution D (z) of the ionized donor concentration (n-type impurity concentration) in the depth direction is represented by the following formula (2). In the formula (2), probability P (z) of the distribution of implanted ions with respect to the depth direction z from the upper surface of the electron supply layer 52 was statistically determined using Monte Carlo calculation. As an activation yield η of the ions, an experimental value actually obtained by subjecting the sample to a hall measurement at room temperature (25° C.) was used.

$$D(z) = \eta \cdot N \cdot P(z) \qquad (2)$$

In the formula (2), N indicates a total effective dose amount. As shown in FIG. 17, when the effective dose amount was $9.2 \times 10^{13}$ (9.2E+13) cm$^{-2}$, a potential was not sufficiently reduced at each of an ohmic contact part (upper surface of the electron supply layer 52 of AlGaN), an inside of the electron supply layer 52 of AlGaN, and an AlGaN/GaN heterojunction part (heterojunction interface). On the other hand, a contact resistance Rc (n) was 0.32 Ωmm, a sheet resistance was 4310 Ω/square, and a junction resistance Rb was 2.91 Ωmm, which were high. When the effective dose amount was $9.2 \times 10^{15}$ (9.2E+15) cm$^{-2}$, a potential was sufficiently reduced at each of the ohmic contact part (upper surface of the electron supply layer 52 of AlGaN), the electron supply layer 52 of AlGaN, and the AlGaN/GaN heterojunction part (heterojunction interface). On the other hand, a contact resistance Rc (n) was 0.032 Ωmm, a sheet resistance Rsh (n) was 106 Ω/square, and a junction resistance Rb was 0.17 Ωmm, which were experimentally sufficiently low.

Figure 18:
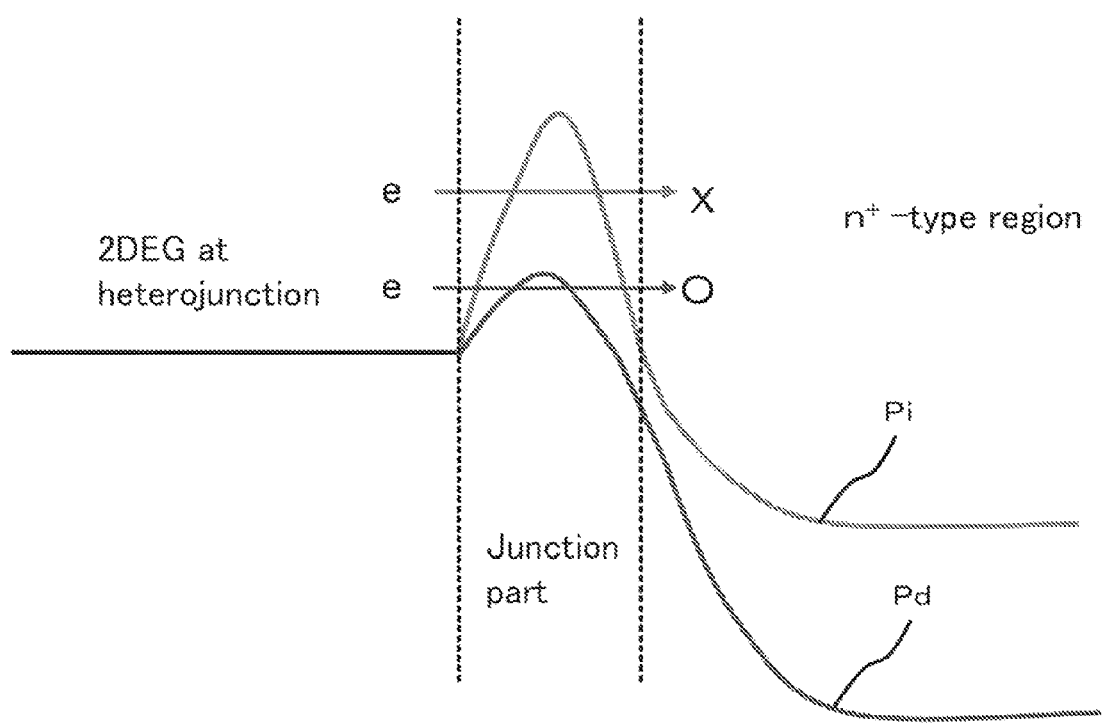
FIG. 18 is a diagram illustrating an energy band in the horizontal direction, describing a mechanism of reducing a junction resistance.

It is considered that the reduction in junction resistance is achieved by reducing a potential at the AlGaN/GaN heterojunction part to be sufficiently lower than the Fermi level. FIG. 18 is a schematic view in order to describe this consideration using a band structure in "the horizontal direction". Two types of potentials Pi and Pd are shown in FIG. 18. As shown in FIG. 18, when a sufficient amount of ionized donor is present in each of the n$^+$-type impurity implantation regions that is in the neighborhood of the two-dimensional electron gas layer generated by a semiconductor heterojunction (2DEG by a heterojunction), the potential Pd at each of the regions becomes lower than the potential Pi in the case where a sufficient amount of ionized donor is not present. It is assumed that accompanying the reduction, a height of the barrier at each of the junction parts is reduced, whereby the junction resistance is reduced. Note here that FIG. 18 is an illustrative schematic view and does not limit the present invention.

In order to sufficiently reduce the potential at each of the n$^+$-type impurity implantation regions that is in the neighborhood of the two dimensional electron gas layer at room temperature, it is preferred that "the ionized donor impurity concentration at room temperature is $1\times10^{19}$ (1E19) cm$^{-3}$ or more" as described above. Therefore, in order to reduce the junction resistance, increasing the effective dose amount itself is effective, and increasing an activation yield of implanted ions by increasing a temperature at which an activation annealing is conducted is also effective. From the viewpoint of increasing the activation yield, an "elevated-temperature ion implantation" that is an ion implantation conducted in the state where a temperature of a substrate at the time of ion implantation is increased is also effective. As mentioned above, in the case where a temperature at which a device (HEMT of the present invention) is operated is greatly different from the room temperature (for example, in the case where the device is operated in an engine room of automobile), it is preferred in order to reduce the junction resistance that an ionized donor impurity concentration at the temperature at which the HEMT of the present invention is operated is $1\times10^{19}$ cm$^{-3}$ or more.

The HEMT of the present invention is described above using FIGS. 9 to 18. The present invention, however, is not limited by these descriptions. For example, an experimental data is an example in the case where an electron supply layer is AlGaN, and an electron transit layer is GaN. The compositions, the thicknesses, and the like of the electron supply layer and the electron transit layer are not limited to the above-described values.

EXAMPLE 1

Preferred examples of the HEMT 1 of the first embodiment, the HEMT 2 of the second embodiment, the HEMT 3 of the third embodiment, and the HEMT 4 of the fourth embodiment are described below.

In Example 1, HEMT having the same structure as the HEMT 1 (FIG. 2) of the first embodiment was produced as described below. In the following Examples 1 to 4, the "dose amount" refers to a dose amount including an amount to be absorbed into a through film, and the effective dose amount is about 8% lower than the dose amount.

First, an i-Al$_{0.15}$Ga$_{0.85}$N (with the thickness of 45 nm)/i-GaN heterojunction epitaxial film (electron supply layer 12 and electron transit layer 11 of FIG. 2) was grown on a 3-inch Si substrate (substrate 10 of each of FIGS. 1 and 2) (electron transit layer forming step and electron supply layer forming step). The "3-inch" is the length of the Si substrate. One inch is about 2.54 cm, and thus, the length of the Si substrate is about 7.62 cm. In order to form an alignment mark used after these steps, a part of an upper surface of a sample thus produced was patterned using a resist, and thereafter, a mesa step was formed in the part of the upper surface of the sample by dry etching.

Then, the sample was subjected to organic cleaning, and thereafter a 80 nm-thick nitride film (SiN film) as a through film was deposited on an upper surface of the i-AlGaN layer (electron supply layer 12). Subsequently, in order to selectively form high-concentration n$^+$-type layers (n-type conductive layer regions), the sample was further patterned using a resist and then subjected to an ion-implantation of Si (atomic weight: 28) that is an n-type impurity (donor impurity), i.e., doping at a tilt angle of 7° (at the acceleration energy of 100 keV and with the dose amount of $1\times10^{16}$ cm$^{-2}$). A density of implanted ions (n-type impurity concentration) in a two-dimensional electron gas layer of each region subjected to the doping (heterojunction interface of the electron transit layer 11 with the electron supply layer 12) was about $1\times10^{21}$ cm$^3$. Thereafter, the through film was removed using hydrofluoric acid.

Next, in order to activate the Si as an ion-implanted dopant (n-type impurity), an annealing treatment was conducted. First, the resist was removed from the sample, and a silicon oxynitride film of Si$_2$O$_x$N$_y$ (the range of x satisfies 0<x≤1.0, and the range of y satisfies 1<y≤4) as an annealing protective film with the thickness of 1200 Å was deposited on each of an upper surface, a back surface (lower surface), and side surfaces of the sample by a plasma CVD method.

Then, an annealing treatment (activation annealing) was conducted by maintaining the sample in a nitrogen atmosphere at 1200° C. for 3 minutes. Thus, n-type conductive layer regions 13A and 13B were formed (n-type conductive layer region forming step). Further, in order to remove the annealing protective film, the sample was immersed into concentrated hydrofluoric acid (containing 49% of hydrogen fluoride) for 5 minutes and then was washed with water.

Subsequently, a metal formed of Ni/Au was deposited between a source electrode formation planned region and a drain electrode formation planned region on an upper surface of the i-AlGaN layer (electron supply layer 12), and thus, a gate electrode 14 was formed (gate electrode forming step). Then, the sample was yet further patterned using a resist and was thereafter subjected to a surface treatment using hydrochloric acid. Thus, a Ti/Al/Nb/Au multilayer film as an ohmic metal was evaporated. Thereafter, the sample was subjected to a lift-off treatment and then an alloy treatment by RTA (Rapid Thermal Annealing) at 850° C. for 30 seconds. Thus, an ohmic contact was formed. In this way, a source electrode 15A was formed on the n-type conductive layer region 13A, and a drain electrode 15B was formed on the n-type conductive layer region 13B (source electrode forming step and drain electrode forming step).

Then, the sample was yet further patterned using a resist and was then subjected to two-stage ion implantation of N (atomic weight: 14) at a tilt angle of 7°. Thus, an isolator was formed. In the first ion implantation, the acceleration energy was 100 keV, and the dose amount was $1\times10^{14}$ cm$^{-2}$, and in the second ion implantation, the acceleration energy was 20 keV, and the dose amount was $1\times10^{14}$ cm$^{-2}$. Thereafter, the resist was removed. In this way, the HEMT having the same structure as the HEMT 1 shown in FIG. 2 was produced. Properties of this HEMT were evaluated by conducting a hall measurement and an electrical measurement using a TLM pattern.

In each of the n$^+$-type impurity implantation regions (n-type conductive layer regions) of the HEMT of the present example (Example 1), a contact resistance (ohmic contact resistance) satisfied Rc=0.03 Ωmm, which was favorable, and a sheet resistance (resistance of 2DEG layer 28) satisfied 106 Ω/square, which was favorable. A junction resistance between each of the n$^+$-type impurity implantation regions (n-type conductive layer regions) and a channel region was 0.170 mm, which was very small as compared with a junction resistance of a general HEMT.

EXAMPLE 2

In the present example (Example 2), HEMT having the same structure as the HEMT 2 (FIG. 4) of the second embodiment was produced as described below.

First, an i-Al$_{0.15}$Ga$_{0.85}$N (with the thickness of 45 nm)/i-GaN heterojunction epitaxial film (electron supply layer 22 and electron transit layer 21 of FIG. 4) was grown on a 3-inch Si substrate (substrate 10 of each of FIGS. 3 and 4) that is the same as in Example 1 (electron transit layer forming step and electron supply layer forming step). In order to form an alignment mark used after these steps, a part of an upper surface of a sample thus produced was patterned using a resist, and a mesa step was formed in the part of the upper surface of the sample by dry etching.

Then, the sample was subjected to organic cleaning, and thereafter, a 80 nm-thick nitride film (SiN film) as a through film was deposited on an upper surface of the i-AlGaN layer (electron supply layer 22). Subsequently, in order to selectively form high-concentration n$^+$-type layers (n-type conductive layer regions), the sample was further patterned using a resist and then subjected to two-stage ion implantation of an n-type impurity (donor impurity), i.e., doping at a tilt angle of 7°. In the first ion implantation, the acceleration energy was 300 keV, and the dose amount was $3\times10^{15}$ cm$^{-2}$. A second ion implantation was conducted to regions each including each part to which the first ion implantation has been conducted and a channel region of a two-dimensional electron gas layer (28 in FIGS. 3 and 4). In the second ion implantation, the acceleration energy was 100 keV, and the dose amount of Si was $1\times10^{16}$ cm$^{-2}$.

In the second ion implantation (doping), a density of ions to be implanted into the channel region (heterojunction interface of an upper surface of the electron transit layer 21 with the electron supply layer 22) was about $1\times10^{21}$ cm$^{-3}$. Dependency of an ion implantation profile on the dose amount in the case where the acceleration energy was 100 keV is as shown in FIG. 12. After two-stage doping, the through film was removed using hydrofluoric acid.

Next, in order to activate the Si as an ion-implanted dopant (n-type impurity), an annealing treatment was conducted. First, the resist was removed from the sample, and a silicon oxynitride film of Si$_2$O$_x$N$_y$ (the range of x satisfies 0<x≤1.0, and the range of y satisfies 1<y≤4) as an annealing protective film with the thickness of 1200 Å was deposited on each of an upper surface, a back surface (lower surface), and side surfaces of the sample by a plasma CVD method.

An annealing treatment (activation annealing) was conducted by maintaining the sample in a nitrogen atmosphere at 1200° C. for 3 minutes. Thus, n-type conductive layer regions 24A, 25A, 24B, and 25B were formed (n-type conductive layer region forming step). Further, in order to remove the annealing protective film, the sample was immersed into concentrated hydrofluoric acid (containing 49% of hydrogen fluoride) for 5 minutes and then was washed with water.

Subsequently, a metal formed of Ni/Au was deposited between a source electrode formation planned region and a drain electrode formation planned region both of which is on an upper surface of the i-AlGaN layer (electron supply layer 22), and thus, a gate electrode 23 was formed (gate electrode forming step). Then, the sample was yet further patterned using a resist and was thereafter subjected to a surface treatment using hydrochloric acid. Thus, a Ti/Al/Nb/Au multilayer film as an ohmic metal was evaporated. Thereafter, the sample was subjected to a lift-off treatment and then an alloy treatment by RTA (Rapid Thermal Annealing) at 850° C. for 30 seconds. Thus, an ohmic contact was formed. In this way, a source electrode 26A was formed on the n-type conductive layer region 24A, and a drain electrode 26B was formed on the n-type conductive layer region 25B (source electrode forming step and drain electrode forming step).

Then, the sample was yet further patterned using a resist and was then subjected to two-stage ion implantation of N (atomic weight: 14) at a tilt angle of 7°. Thus, an isolator was formed. In the first ion implantation, the acceleration energy was 100 keV, and the dose amount of N was $1\times10^{14}$ cm$^{-2}$, and in the second ion implantation, the acceleration energy was 20 keV, and the dose amount was $1\times10^{14}$ cm$^{-2}$. Thereafter, the resist was removed. In this way, the HEMT having the same structure as the HEMT 2 shown in FIG. 4 was produced. Properties of this HEMT were evaluated by conducting a hall measurement and an electrical measurement using a TLM pattern.

In each of the n$^+$-type impurity implantation regions (n-type conductive layer regions) of the HEMT of the present example (Example 2), a contact resistance (ohmic contact resistance) satisfied Rc=0.03 Ωmm, which was favorable, and a sheet resistance (resistance of 2DEG layer 28) satisfied 110 Ω/square, which was favorable. A junction resistance between each of the n$^+$-type impurity implantation regions (n-type conductive layer regions) and a channel region was 0.17 Ωmm, which was very small as compared with a junction resistance of a general HEMT. According to the producing process of the present example, by the first ion implantation, the HEMT having a structure that includes n-type layers (n-type conductive layer regions) with a high concentration to the deep part thereof could be obtained.

EXAMPLE 3

In the present example (Example 3), HEMT having the same structure as the HEMT 3 (FIG. 6) of the third embodiment was produced as described below.

First, an i-Al$_{0.15}$Ga$_{0.85}$N (with the thickness of 45 nm)/i-GaN heterojunction epitaxial film (electron supply layer 32 and electron transit layer 31 of FIG. 5) was grown on a 3-inch Si substrate (substrate 30 of each of FIGS. 5 and 6) that is the same as in Example 1 (electron transit layer forming step and electron supply layer forming step). In order to form an alignment mark used after these steps, a part of an upper surface of a sample thus produced was patterned using a resist, and a mesa step was formed in the part of the upper surface of the sample by dry etching.

Then, the sample was subjected to organic cleaning, and thereafter a 80 nm-thick nitride film (SiN film) as a through film was deposited on an upper surface of the i-AlGaN layer (electron supply layer 32). Subsequently, in order to selectively form high-concentration n$^+$-type layers (n-type conductive layer regions), the sample was further patterned using a resist and then subjected to an ion-implantation of Si (atomic weight: 28) that is an n-type impurity (donor impurity), i.e., doping at, a tilt angle of 7° (at the acceleration energy of 100 keV and with the dose amount of $1\times10^{16}$ cm$^{-2}$). A density of implanted ions (n-type impurity concentration) in a two-dimensional electron gas layer (heterojunction interface of the electron transit layer 31 with the electron supply layer 32) of each region subjected to the doping was about $1\times10^{20}$ cm$^{-3}$. Thereafter, the through film was removed using hydrofluoric acid.

Next, in order to activate the Si as an ion-implanted dopant (n-type impurity), an annealing treatment was conducted. First, the resist was removed from the sample, and a silicon oxynitride film of Si$_2$O$_x$N$_y$ (the range of x satisfies $0<x\leq1.0$, and the range of y satisfies $1<y\leq4$) as an annealing protective film with the thickness of 1200 Å was deposited on each of an upper surface, a back surface (lower surface), and side surfaces of the sample by a plasma CVD method.

Then, an annealing treatment (activation annealing) was conducted by maintaining the sample in a nitrogen atmosphere at 1200° C. for 3 minutes. Thus, n-type conductive layer regions 33A and 33B were formed (n-type conductive layer region forming step). Further, in order to remove the annealing protective film, the sample was immersed into concentrated hydrofluoric acid (containing 49% of hydrogen fluoride) for 5 minutes and then was washed with water.

Next, the sample was patterned using a resist, and then regions on an upper surface of the electron supply layer 32 in the sample, which are wider than the respective ion-implanted regions (n-type conductive layer regions 33A and 33B) were subjected to plasma etching (dry surface treatment) using a SF$_6$ (sulfur hexafluoride) gas. By this dry surface treatment, damage to the electron supply layer 32 was reduced, and the electron supply layer 32 became the electron supply layer 32P (FIG. 6).

Subsequently, a metal formed of Ni/Au was deposited between a source electrode formation planned region and a drain electrode formation planned region on an upper surface of the i-AlGaN layer (electron supply layer 32P), and thus, a gate electrode 34 was formed (gate electrode forming step). Then, a Ti/Al/Nb/Au multilayer film as an ohmic metal was evaporated so that it covers regions on the electron supply layer 32P, which have been subjected to the dry surface treatment. Thereafter, the sample was subjected to a lift-off treatment and then an alloy treatment by RTA (Rapid Thermal Annealing) at 850° C. for 30 seconds. Thus, an ohmic contact was formed. In this way, a source electrode 35A was formed on the n-type conductive layer region 33A, and a drain electrode 35B was formed on the n-type conductive layer region 33B (source electrode forming step and drain electrode forming step).

Then, the sample was yet further patterned using a resist and was then subjected to two-stage ion implantation of N (atomic weight: 14) at a tilt angle of 7°. Thus, an isolator was formed. In the first ion implantation, the acceleration energy was 100 keV, and the dose amount was $1\times10^{14}$ cm$^{-2}$ and in the second ion implantation, the acceleration energy was 20 key, and the dose amount was $1\times10^{14}$ cm$^{-2}$. Thereafter, the resist was removed. In this way, the HEMT having the same structure as the HEMT 3 shown in FIG. 6 was produced. Properties of this HEMT were evaluated by conducting a hall measurement and an electrical measurement using a TLM pattern.

In each of the n$^+$-type impurity implantation regions (n-type conductive layer regions) of the HEMT of the present example (Example 3), a contact resistance (ohmic contact resistance) satisfied Rc=0.02 Ωmm, which was favorable, and a sheet resistance (resistance of 2DEG layer 28) satisfied 103 Ω/square, which was favorable. A junction resistance between each of the n$^+$-type impurity implantation regions (n-type conductive layer regions) and a channel region was 0.13 mm, which was very small as compared with the junction resistance of a general HEMT and was improved as compared with Example 1.

EXAMPLE 4

In the present example (Example 4), HEMT having the same structure as the HEMT 4 (FIG. 8) of the fourth embodiment was produced as described below.

First, an i-Al$_{0.15}$Ga$_{0.85}$N (with the thickness of 45 nm)/i-GaN heterojunction epitaxial film (electron supply layer 42 and electron transit layer 41 of FIG. 7) was grown on a 3-inch Si substrate (substrate 10 of each of FIGS. 7 and 8) that is the same as in Example 1 (electron transit layer forming step and electron supply layer forming step). In order to form an alignment mark used after these steps, a part of an upper surface of a sample thus produced was patterned using a resist, and a mesa step was formed in the part of the upper surface of the sample by dry etching.

Then, the sample was subjected to organic cleaning, and thereafter, a 80 nm-thick nitride film (SiN film) as a through film was deposited on an upper surface of the i-AlGaN layer (electron supply layer 42). Subsequently, in order to selectively form high-concentration n$^+$-type layers (n-type conductive layer regions), the sample was further patterned using a resist and then subjected to two-stage ion implantation of an n-type impurity (donor impurity), i.e., doping, at a tilt angle of 7°. In the first ion implantation, the acceleration energy was 300 keV, and the dose amount was $3\times10^{15}$ cm$^{-2}$. A second ion implantation was conducted to regions each including each part to which the first ion implantation has been conducted and a channel region of a two-dimensional electron gas layer (48 in FIGS. 7 and 8). In the second ion implantation, the acceleration energy was 100 keV, and the dose amount of Si was $1\times10^{16}$ cm$^{-2}$. In the second ion implantation (doping), a density of ions to be implanted into the channel region (heterojunction interface of an upper surface of the electron transit layer 41 with the electron supply layer 42) was about $1\times10^{21}$ cm$^{-3}$. Dependency of an ion implantation profile on the dose amount in the case where the acceleration energy was 100 keV is as shown in FIG. 12. After two-stage doping, the through film was removed using hydrofluoric acid.

Next, in order to activate the Si (atomic weight: 28) as an ion-implanted dopant (n-type impurity), an annealing treatment was conducted. First, the resist was removed from the sample, and a silicon oxynitride film of Si$_2$O$_x$N$_y$ (the range of x satisfies $0<x\leq1.0$, and the range of y satisfies $1<y\leq4$) as an annealing protective film with the thickness of 1200 Å was deposited on each of an upper surface, a back surface (lower surface), and side surfaces of the sample by a plasma CVD method.

An annealing treatment (activation annealing) was conducted by maintaining the sample in a nitrogen atmosphere at 1200° C. for 3 minutes. Thus, n-type conductive layer regions 44A, 45A, 44B, and 45B were formed (n-type conductive layer region forming step). Further, in order to remove the annealing protective film, the sample was immersed into concentrated hydrofluoric acid (containing 49% of hydrogen fluoride) for 5 minutes and then was washed with water.

Next, the sample was patterned using a resist, and then regions on an upper surface of the electron supply layer 42 in the sample, which are wider than the respective ion-implanted regions (n-type conductive layer regions 45A and 45B) were subjected to plasma etching (dry surface treatment) using a SF$_6$ (sulfur hexafluoride) gas. The damage to the electron supply layer 42 was reduced by this dry surface treatment, whereby the electron supply layer 42 became the electron supply layer 42P (FIG. 8).

Subsequently, a metal formed of Ni/Au was deposited between a source electrode formation planned region and a drain electrode formation planned region on an upper surface of the i-AlGaN layer (electron supply layer 42P), and thus, a gate electrode 43 was formed (gate electrode forming step). Then, a Ti/Al/Nb/Au multilayer film as an ohmic metal was evaporated so as to cover regions on the electron supply layer 42P, which have been subjected to the dry surface treatment. Thereafter, the sample was subjected to a lift-off treatment and then an alloy treatment by RTA (Rapid Thermal Annealing) at 850° C. for 30 seconds. Thus, an ohmic contact was formed. In this way, a source electrode 46A was formed on the n-type conductive layer region 45A, and a drain electrode 46B was formed on the n-type conductive layer region 45B (source electrode forming step and drain electrode forming step).

Then, the sample was yet further patterned using a resist and was then subjected to two-stage ion implantation of N (atomic weight: 14) at a tilt angle of 7°. Thus, an isolator was formed. In the first ion implantation, the acceleration energy was 100 keV, and the dose amount was $1 \times 10^{14}$ cm$^{-2}$, and in the second ion implantation, the acceleration energy was 20 keV, and the dose amount was $1 \times 10^{14}$ cm$^{-2}$. Thereafter, the resist was removed. In this way, the HEMT having the same structure as the HEMT 4 shown in FIG. 8 was produced. Properties of this HEMT were evaluated by conducting a hall measurement and an electrical measurement using a TLM pattern.

In each of the n$^+$-type impurity implantation regions (n-type conductive layer regions) of the HEMT of the present example (Example 4), a contact resistance (ohmic contact resistance) satisfied Rc=0.02 mm, which was favorable, and a sheet resistance (resistance of 2DEG layer 48) satisfied 103 Ω/square, which was favorable. A junction resistance between each of the n$^+$-type impurity implantation regions (n-type conductive layer regions) and a channel region was 0.13 Ωmm which was very small as compared with a junction resistance of a general HEMT and was improved as compared with Example 1. According to the producing process of the present example, by the first ion implantation, HEMT having a structure that includes n-type layers (n-type conductive layer regions) with a high concentration to the deep part thereof could be obtained.

The embodiments and the preferred examples of the present invention are described above with reference to the drawings and the like. As mentioned above, the electronic device of the present invention includes the heterojunction field effect transistor of the present invention. The intended use of the electronic device of the present invention is not particularly limited, and it can be widely used for, for example, power control devices, motor control devices (for electric cars and air conditioners, for example), power-supply devices (for computers, for example), inverter lighting, high-frequency power generators (for microwave ovens and electromagnetic cooking devices, for example), image displays, information recording and reproducing devices, communication devices, and arithmetic devices (including the HEMT of the present invention as an arithmetic element, for example), for example.

The embodiments and the examples are illustrative of the present invention. The present invention is not limited to the embodiments and the examples, and various configurations besides them can be employed. For example, the structure of HEMT of each embodiment has a single-heterostructure having a single heterojunction interface, and the present invention, however, is not limited thereto. For example, the HEMT of the present invention may have a double-heterostructure having two heterojunction interfaces. The double-heterostructure can be, for example, an AlGaN/GaN/AlGaN/GaN structure.

In each of the embodiments, a two-dimensional electron gas layer is formed at a heterojunction interface and in the neighborhood thereof. The structure of the HEMT can be configured so that a one-dimensional electron gas layer is formed as substitute for a two-dimensional electron gas layer.

In each of the embodiments, as a particularly preferred example in order to obtain a high-concentration ionized donor impurity, introducing silicon (atomic weight: 28) (doping with silicon) as an n-type impurity is described. The n-type impurity (donor impurity) is not limited to this, and for example, silicon (atomic weight: 29) may be introduced as substitute for silicon (atomic weight: 28). Further, it is possible to obtain the high-concentration ionized donor impurity by introducing oxygen, sulfur, selenium, or tellurium as an n-type impurity.

The each embodiment shows a form in which an source electrode and a drain electrode are each directly in ohmic contact with the upper surface of the electron supply layer, and they, each may be arranged on the electron supply layer via the other semiconductor layer or the like. The each embodiment shows a form in which a gate electrode is arranged directly on the upper surface of the electron supply layer, and for example, it may be arranged on the electron supply layer via a gate insulation film or the like.

In the course of developing a compound semiconductor device, it has been studied that n-type layers are selectively formed in the device using an ion implantation of a dopant and thermal diffusion in order to reduce an access resistance or an on, resistance. Specifically in the case of using a heterojunction field effect transistor operated in an enhancement mode having normally-off characteristics, carriers in a channel region of a two-dimensional electron gas tends to be depleted because of its structure, whereby an access resistance, an on resistance, and the like of an element are increased. Therefore, as mentioned above, selectively forming n-type layers in a heterojunction field effect transistor using an ion implantation and thermal diffusion has been actively conducted. However, in a device using a III-V compound semiconductor of GaAs or InP, there is a problem in that when n-type layers are formed in this device by introducing a dopant, the dopant is diffused in the device, which results in degradation of properties of the device. Specifically, unnecessary diffusion of the dopant (for example, diffusion of Si in GaAs) in a channel region at a heterojunction part in a semiconductor having a structure of a heterojunction field effect transistor may cause fatal degradation of properties of the device. Therefore, a device such as MESFET (Metal-Semiconductor Field Effect Transistor) may have n-type layers selectively formed using ion implantation and thermal diffusion. On the other hand, in a heterojunction field effect transistor having a channel region at a semiconductor heterojunction part, selectively forming n-type layers using ion implantation and thermal diffusion has not been industrially conducted from the viewpoint of device reliability as for now.

However, nowadays, selectively forming n-type layers by ion-implanting a dopant such as Si into a semiconductor structure (for example, a AlGaN/GaN structure) that is below an ohmic electrode is tried in order to reduce an access resistance, an on resistance, and the like of the GaN heterojunction field effect transistor. This is because a dopant such as Si ion-implanted into a GaN material is difficult to be diffused as compared with the case where it is ion-implanted into GaAs or InP, and this raises expectations to a technology of ion implantation into the GaN material. For example, when Si as a dopant is ion-implanted into GaN, and annealing is conducted at 1,300° C., diffusion of Si due to the annealing is hardly observed.

However, the access resistance, the on resistance, and the like of GaN HEMT were large to the extent of not being able to disregard in a device operation. As shown in FIG. 19, a major cause to inhibit the reduction in access resistance, on resistance, and the like is that an electric resistance (junction resistance) at each of junction parts R1 and R2 between the n-type impurity implantation regions 105A and 105B and a region below the gate electrode 106 in the electrode transit layer 102 (region in which a channel should be formed) is high. This point is, as mentioned above, found out by the inventors of the present invention through examinations such as experiments and the like. As mentioned above, this each junction resistance causes, as a contact resistance, an increase in access resistance, on resistance, and the like of HEMT 100.

Specifically, in the case of using a heterojunction field effect transistor operated in enhancement mode having normally-off characteristics, it is required to reduce an access resistance, an on resistance, and the like of an element by reducing an junction resistance at each of the junction parts R1 and R2 through a selective formation of n-type layer. It is considered that when the above-mentioned junction resistance is reduced, the GaN HEMT having superior properties because of having a low on resistance as compared with the SiC power device can be obtained, for example.

As mentioned above, according to the present invention, it is possible to provide a heterojunction field effect transistor with a low access resistance, a low on resistance, and the like, a heterojunction filed effect transistor production method, and an electronic device.

The invention of the present application is described above with reference to the embodiments and the examples. The invention of the present application, however, is not limited to the above-described embodiments and the examples. Various changes in construction and a detail of the invention, understood by those skilled in the art, can be made within the scope of the invention.

1 to 4 Heterojunction field effect transistor (HEMT)
10, 20, 30, 40, and 50 Substrate
11, 21, 31, and 41 Electron transit layer
12, 22, 32, 42, 32P, and 42P Electron supply layer
13A, 13B, 24A, 24B, 25A, and 25B n-type conductive layer region
33A, 33B, 44A, 44B, 45A, and 45B n-type conductive layer region
14 and 34 Gate electrode
15A, 26A, 35A, and 46A Source electrode
15B, 26B, 35B, and 46B Drain electrode
18, 28, 38, and 48 Low dimensional electron gas layer
23 and 43 Gate electrode

The invention claimed is:

1. A heterojunction field effect transistor, comprising:
a substrate;
an electron transit layer comprising a Group III nitride semiconductor, the electron transit layer being formed on the substrate;
an electron supply layer comprising a Group III nitride semiconductor, the electron supply layer forming a heterojunction with an upper surface of the electron transit layer;
a gate electrode;
a source electrode; and
a drain electrode, the gate electrode, the source electrode, and the drain electrode being arranged on the electron supply layer,
wherein n-type conductive layer regions each extended from an upper part of the electron transit layer to an upper surface of the electron supply layer are provided in at least a part below the source electrode and a part below the drain electrode,
wherein a concentration of an n-type impurity at a heterojunction interface of an electron transit layer part in each of the n-type conductive layer regions with the electron supply layer is $1 \times 10^{20}$ cm$^{-3}$ or more, and
wherein the heterojunction field effect transistor is produced by a method for producing the heterojunction field effect transistor, the method comprising:
an electron transit layer forming of, on the substrate, the electron transit layer comprising the Group III nitride semiconductor;
an electron supply layer forming of the electron supply layer through a formation of the heterojunction between the upper surface of the electron transit layer and the Group III nitride semiconductor;
an n-type conductive layer region forming of the n-type conductive layer regions by doping at least a part of the source electrode formation planned region and a part of the drain electrode formation planned region in a region including the upper part of the electron transit layer and the electron supply layer with an n-type impurity ion so that a concentration of the n-type impurity ion at a heterojunction interface of the upper part of the electron transit layer with the electron supply layer becomes $1 \times 10^{20}$ cm$^{-3}$ or more and activating the n-type impurity ion by an annealing treatment;
a source electrode forming of the source electrode on the source electrode formation planned region;
a drain electrode forming of the drain electrode on the drain electrode formation planned region; and
a gate electrode forming of the gate electrode on a region between the source electrode formation planned region and the drain electrode formation planned region,
wherein, in the n-type conductive layer region forming, the concentration of the n-type impurity ion at the heterojunction interface of the upper part of the electron transit layer with the electron supply layer becomes $1 \times 10^{20}$ cm$^{-3}$ or more by doping at least the part of the source electrode formation planned region and the part of the drain electrode formation planned region with the n-type impurity ion at an effective dose amount of the n-type impurity ion of $5 \times 10^{15}$ cm$^{-3}$ or more, and
wherein, in the n-type conductive layer region forming, each of regions to be subjected to the annealing treatment is previously coated with an annealing protective film, and the annealing treatment is conducted at a temperature from 1,100° C. to 1,300° C.

2. The heterojunction field effect transistor according to claim 1, wherein a concentration of an ionized n-type impurity at the heterojunction interface of the electron transit layer part in each of the n-type conductive layer regions with the electron supply layer is $1 \times 10^{19}$ cm$^{-3}$ or more under a temperature condition from 5° C. to 35° C.

3. The heterojunction field effect transistor according to claim 1, wherein a concentration of an ionized n-type impurity at the heterojunction interface of the electron transit layer part in each of the n-type conductive layer regions with the electron supply layer is $1 \times 10^{19}$ cm$^{-3}$ or more under a temperature conduction under which the heterojunction field effect transistor is operated.

4. The heterojunction field effect transistor according to claim 1, wherein the source electrode and the drain electrode are formed so that they cover entire upper surfaces of the n-type conductive layer regions.

5. The heterojunction field effect transistor according to claim 1, wherein the electron transit layer comprises gallium nitride, and the electron supply layer comprises aluminum gallium nitride.

6. An electronic device comprising the heterojunction field effect transistor according to claim 1.

7. A method for producing a heterojunction field effect transistor, said method comprising:
- an electron transit layer forming of, on a substrate, an electron transit layer comprising a Group III nitride semiconductor;
- an electron supply layer forming of an electron supply layer through a formation of a heterojunction between an upper surface of the electron transit layer and a Group III nitride semiconductor;
- an n-type conductive layer region forming of n-type conductive layer regions by doping at least a part of a source electrode formation planned region and a part of a drain electrode formation planned region in a region including an upper part of the electron transit layer and the electron supply layer with an n-type impurity ion so that a concentration of the n-type impurity ion at a heterojunction interface of an upper part of the electron transit layer with the electron supply layer becomes $1 \times 10^{20}$ cm$^{-3}$ or more and activating the n-type impurity ion by an annealing treatment;
- a source electrode forming of a source electrode on the source electrode formation planned region;
- a drain electrode forming of a drain electrode on the drain electrode formation planned region; and
- a gate electrode forming of a gate electrode on a region between the source electrode formation planned region and the drain electrode formation planned region,
- wherein, in the n-type conductive layer region forming, the concentration of the n-type impurity ion at the heterojunction interface of the upper part of the electron transit layer with the electron supply layer becomes $1 \times 10^{20}$ cm$^{-3}$ or more by doping at least the part of the source electrode formation planned region and the part of the drain electrode formation planned region with the n-type impurity ion at an effective dose amount of the n-type impurity ion of $5 \times 10^{15}$ cm$^{-3}$ or more, and
- wherein, in the n-type conductive layer region forming, each of regions to be subjected to the annealing treatment is previously coated with an annealing protective film, and the annealing treatment is conducted at a temperature from 1,100° C. to 1,300° C.

8. The method according to claim 7, wherein, in the n-type conductive layer region forming, the annealing treatment is conducted so that a concentration of an ionized n-type impurity at the heterojunction interface of the electron transit layer part in each of the n-type conductive layer regions with the electron supply layer becomes $1 \times 10^{19}$ cm$^{-3}$ or more under a temperature condition from 5° C to 35° C.

9. The method according to claim 7, wherein, in the n-type conductive layer region forming, the annealing treatment is conducted so that a concentration of an ionized n-type impurity at the heterojunction interface of the electron transit layer part in each of the n-type conductive layer regions with the electron supply layer becomes $1 \times 10^{19}$ cm$^{-3}$ or more under a temperature condition under which the heterojunction field effect transistor is operated.

10. The method according to claim 7, wherein a doping with the n-type impurity ion in the n-type conductive layer region forming comprises:
- a first n-type impurity ion doping; and
- a second n-type impurity ion doping,
- wherein a doping region in the second n-type impurity ion doping includes an end on a gate electrode side of a doping region in the first n-type impurity ion doping and is projected from the end on the gate electrode side, and
- wherein a relationship between an acceleration energy $E_1$ of the doping with the n-type impurity ion in the first n-type impurity ion doping and an acceleration energy $E_2$ of the doping with the n-type impurity ion in the second n-type impurity ion doping satisfies $E_1 > E_2$.

11. The method according to claim 7, further comprising:
- a dry surface treatment of conducting a dry surface treatment by exposing upper surfaces of the n-type conductive layer regions after the n-type conductive layer region forming to a plasma gas,
- wherein, in the dry surface treatment, a dry surface treatment to an upper surface of the source electrode formation planned region is conducted prior to the source electrode forming, and a dry surface treatment to an upper surface of the drain electrode formation planned region is conducted prior to the drain electrode forming.

12. The method according to claim 11, wherein, in the dry surface treatment, each of regions to be subjected to the dry surface treatment includes each of entire upper surfaces of the n-type conductive layer regions, and
- wherein, in the source electrode forming and the drain electrode forming, the source electrode and the drain electrode are formed so that they cover the entire upper surfaces of the n-type conductive layer regions.

13. The method according to claim 7, wherein, in the electron transit layer forming, the Group III nitride semiconductor forming the electron transit layer comprises gallium nitride, and
- wherein, in the electron supply layer forming, the Group III nitride semiconductor forming the electron supply layer comprises aluminum gallium nitride.

* * * * *